(12) United States Patent
Hinode et al.

(10) Patent No.: US 11,569,085 B2
(45) Date of Patent: Jan. 31, 2023

(54) SUBSTRATE PROCESSING METHOD AND SUBSTRATE PROCESSING DEVICE

(71) Applicant: SCREEN Holdings Co., Ltd., Kyoto (JP)

(72) Inventors: Taiki Hinode, Kyoto (JP); Sadamu Fujii, Kyoto (JP)

(73) Assignee: SCREEN Holdings Co., Ltd.

( * ) Notice: Subject to any disclaimer, the term of this patent is extended or adjusted under 35 U.S.C. 154(b) by 346 days.

(21) Appl. No.: 16/646,334

(22) PCT Filed: Jun. 29, 2018

(86) PCT No.: PCT/JP2018/024948
§ 371 (c)(1),
(2) Date: Mar. 11, 2020

(87) PCT Pub. No.: WO2019/058701
PCT Pub. Date: Mar. 28, 2019

(65) Prior Publication Data
US 2020/0273696 A1    Aug. 27, 2020

(30) Foreign Application Priority Data

Sep. 20, 2017  (JP) ............................. JP2017-180697

(51) Int. Cl.
*H01L 21/02* (2006.01)
*B08B 3/08* (2006.01)
(Continued)

(52) U.S. Cl.
CPC .......... *H01L 21/02063* (2013.01); *B08B 3/08* (2013.01); *H01L 21/02052* (2013.01);
(Continued)

(58) Field of Classification Search
None
See application file for complete search history.

(56) References Cited

U.S. PATENT DOCUMENTS

| 2002/0102852 A1* | 8/2002 | Verhaverbeke | .......... C11D 3/32 |
| | | | 257/E21.228 |
| 2006/0178282 A1 | 8/2006 | Suyama et al. | ............... 510/175 |

(Continued)

FOREIGN PATENT DOCUMENTS

| EP | 1 696 476 | 2/2015 |
| JP | 2004-277576 A | 10/2004 |

(Continued)

OTHER PUBLICATIONS

Translation of WO2016194092 by Kurotsuchi, published Dec. 8, 2016.*

(Continued)

*Primary Examiner* — Mikhail Kornakov
*Assistant Examiner* — Ryan L Coleman
(74) *Attorney, Agent, or Firm* — Ostrolenk Faber LLP

(57) ABSTRACT

The natural oxidation film of polysilicon, which is exposed at a side surface of a recess portion 83 provided in a substrate W, is removed and a thin film 84 of polysilicon is exposed at the side surface of the recess portion 83. Liquid IPA is brought into contact with the thin film 84 of polysilicon after the natural oxidation film of polysilicon is removed. Diluted ammonia water is supplied to the substrate W and the thin film 84 of polysilicon is etched after IPA comes into contact with the thin film 84 of polysilicon.

9 Claims, 15 Drawing Sheets

(51) Int. Cl.
*H01L 21/67* (2006.01)
*H01L 21/687* (2006.01)
*B08B 3/04* (2006.01)

(52) U.S. Cl.
CPC .. *H01L 21/67051* (2013.01); *H01L 21/68764* (2013.01); *B08B 3/041* (2013.01)

(56) References Cited

U.S. PATENT DOCUMENTS

| | | | |
|---|---|---|---|
| 2006/0264011 A1 | 11/2006 | Hachigo et al. | 438/483 |
| 2008/0153040 A1 | 6/2008 | Honda | 430/319 |
| 2009/0291567 A1 | 11/2009 | Hachigo et al. | 438/758 |
| 2010/0075504 A1 | 3/2010 | Tomita et al. | 438/706 |
| 2010/0317185 A1 | 12/2010 | Vos et al. | 438/591 |
| 2011/0018105 A1 | 1/2011 | Hachigo et al. | 257/615 |
| 2014/0127908 A1 | 5/2014 | Okutani | 438/694 |
| 2016/0027635 A1 | 1/2016 | Okamura et al. | |

FOREIGN PATENT DOCUMENTS

| | | |
|---|---|---|
| JP | 2006-186081 A | 7/2006 |
| JP | 2006-352075 A | 12/2006 |
| JP | 2007-235146 A | 9/2007 |
| JP | 2008-177532 A | 7/2008 |
| JP | 2014-209595 A | 11/2014 |
| JP | 2015-115409 A | 6/2015 |
| JP | 2016-528551 A | 9/2016 |
| KR | 10-2015-0043 893 A | 4/2015 |
| KR | 10-2016-0012919 A | 2/2016 |
| WO | WO 2015/021297 A1 | 2/2015 |
| WO | WO2016194092 * | 12/2016 |

OTHER PUBLICATIONS

International Search Report dated Aug. 14, 2018 in corresponding PCT International Application No. PCT/JP2018/024948.
Written Opinion dated Aug. 14, 2018 in corresponding PCT International Application No. PCT/JP2018/024948.

* cited by examiner

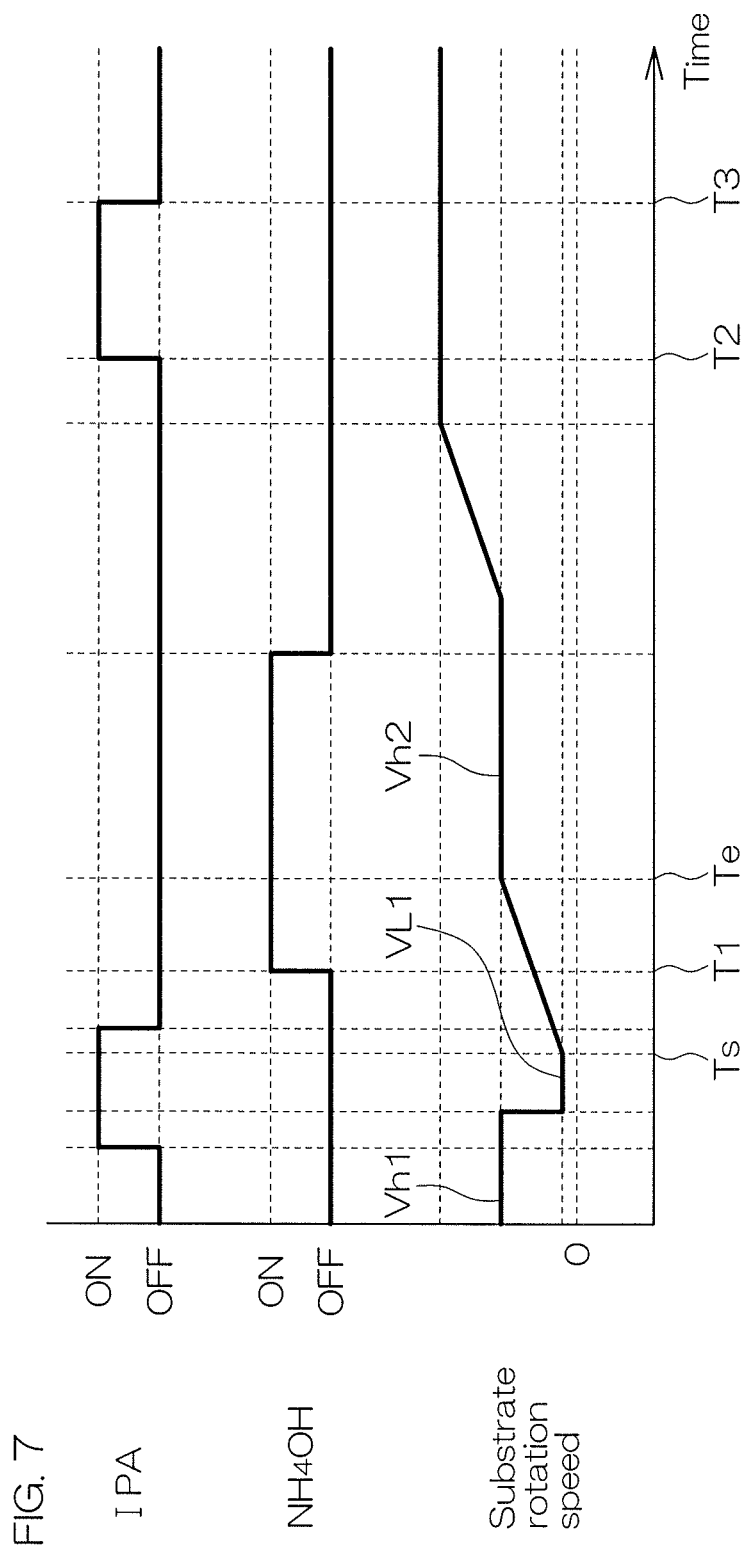

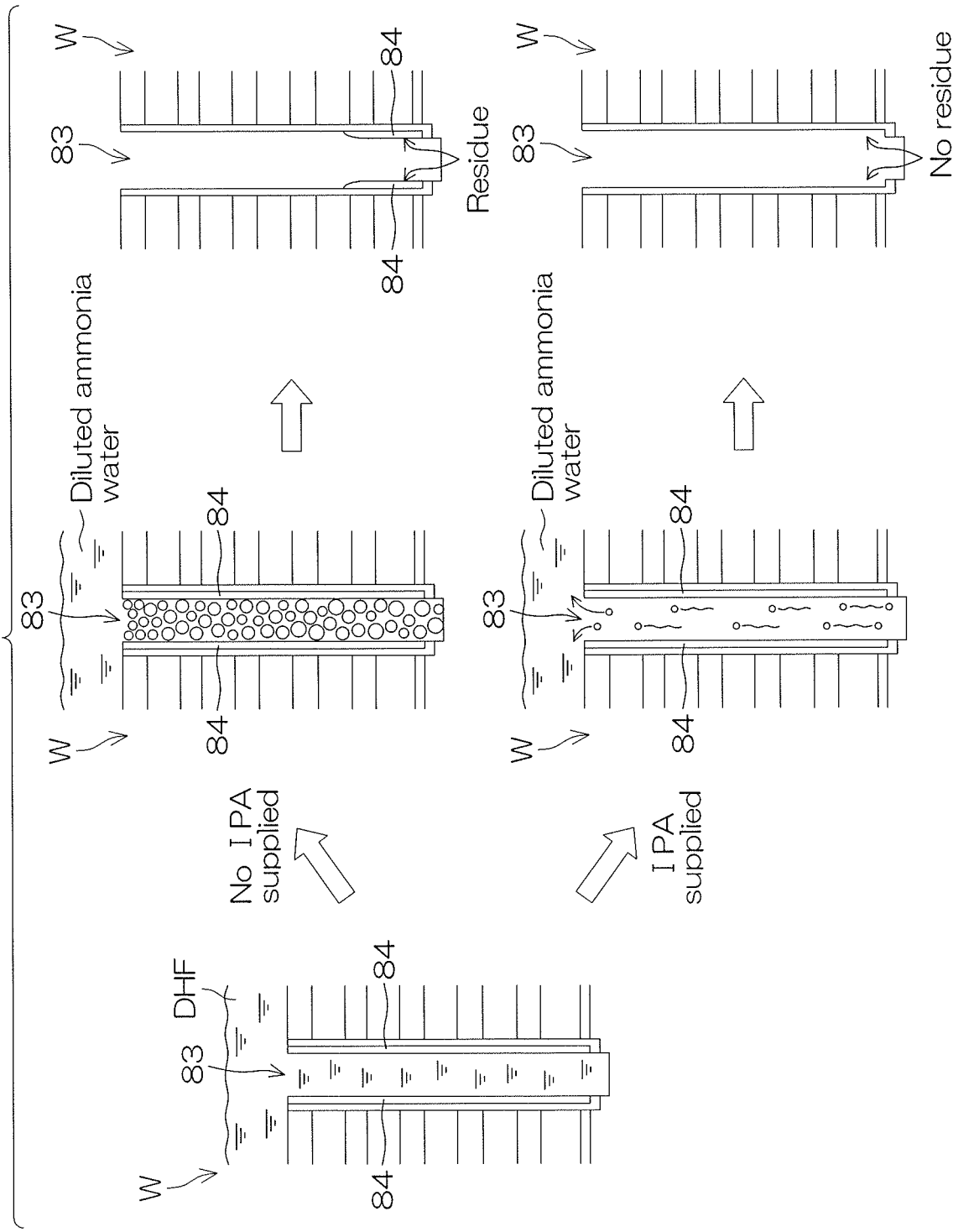

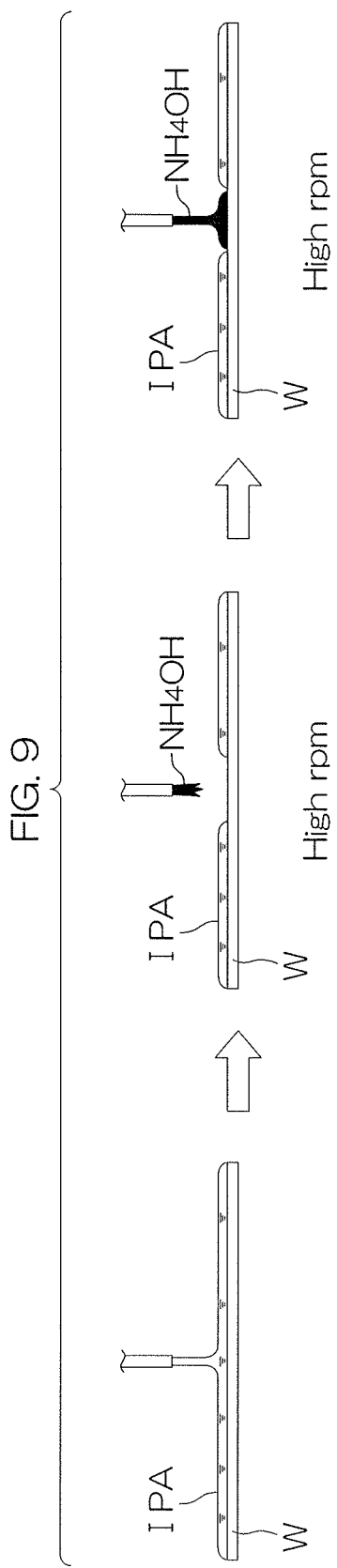

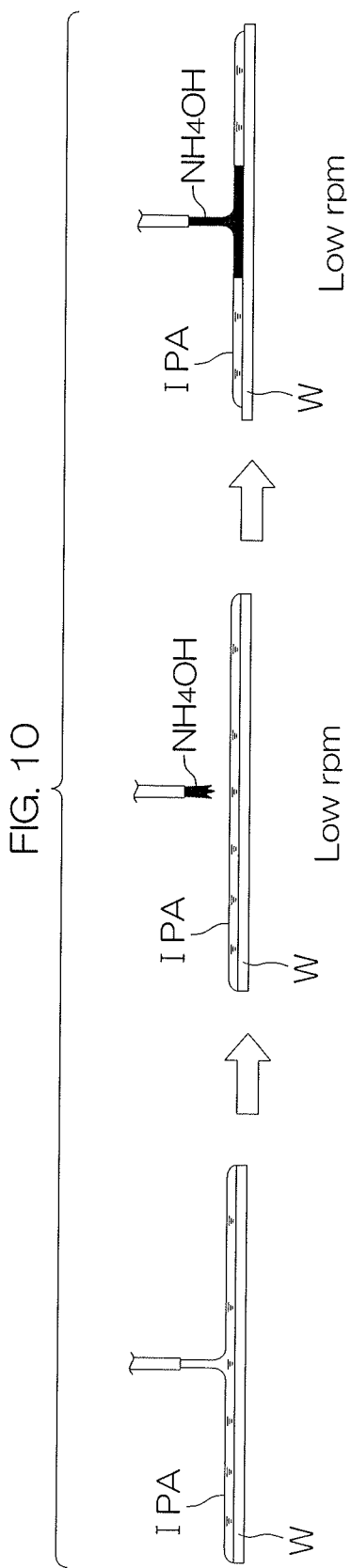

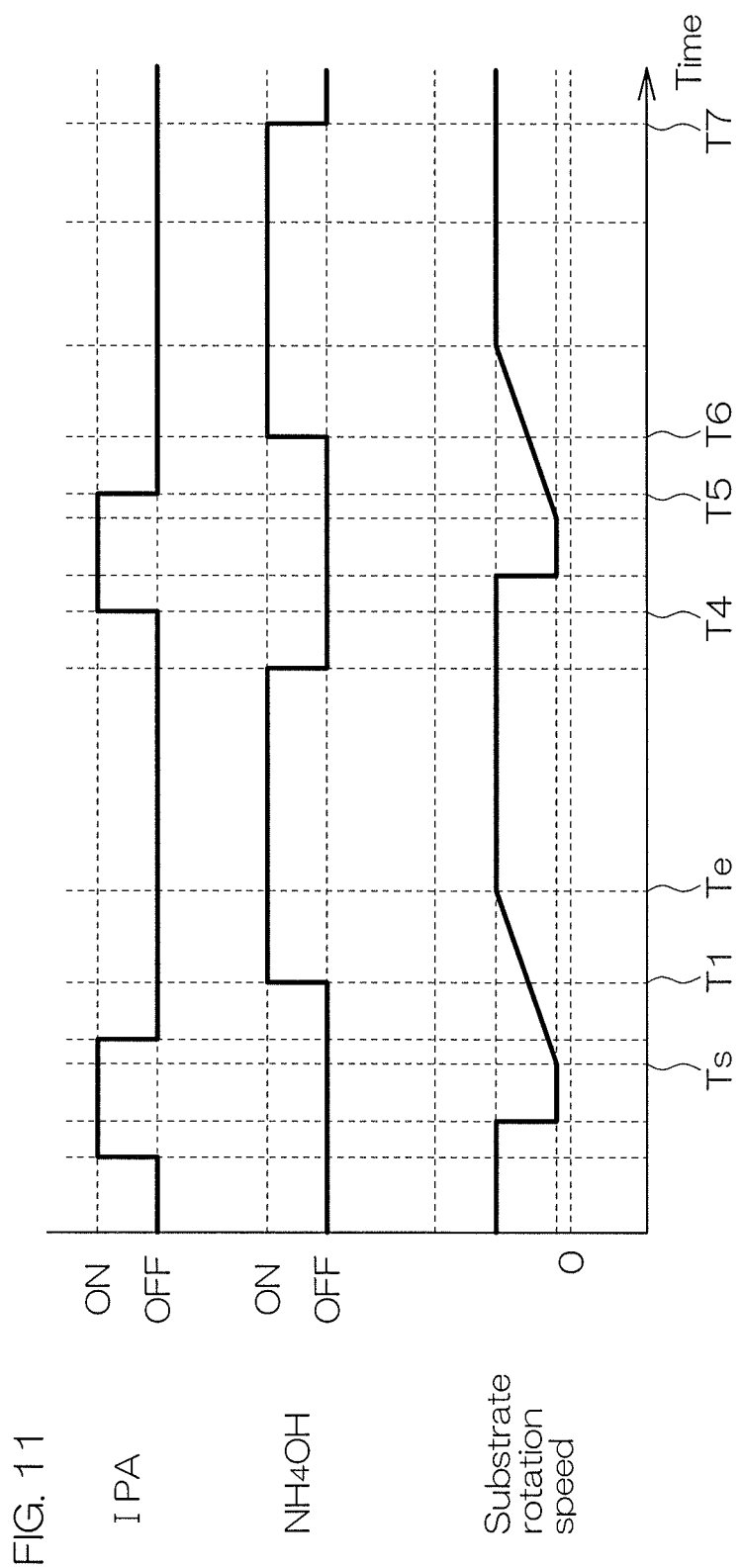

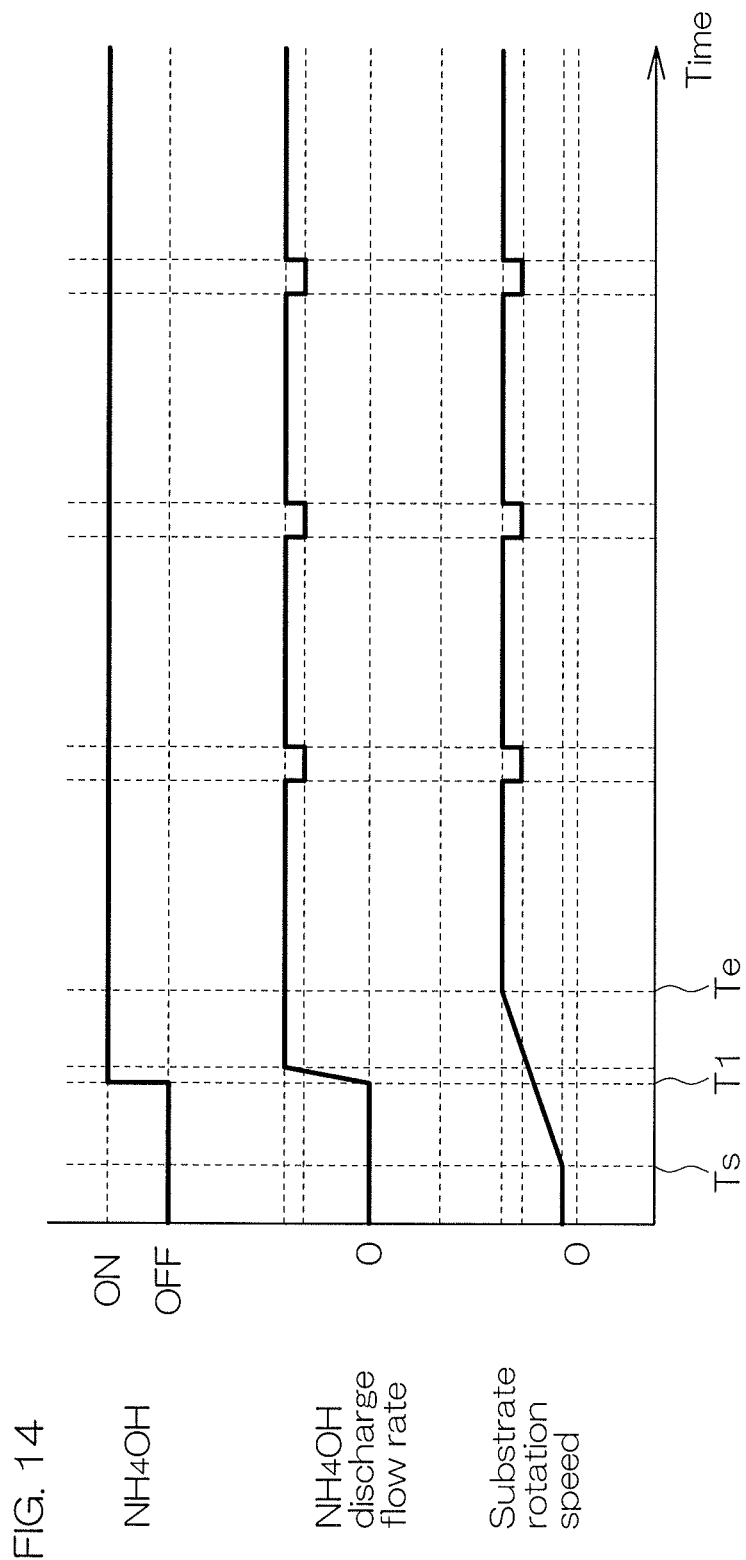

SUBSTRATE PROCESSING METHOD AND SUBSTRATE PROCESSING DEVICE

CROSS-REFERENCE TO RELATED APPLICATIONS

The present application is a 35 U.S.C. §§ 371 national phase conversion of PCT International Application No. PCT/JP2018/024948, filed Jun. 29, 2018, which claims priority to Japanese Patent Application No. 2017-180697, filed Sep. 20, 2017, the contents of both of which are incorporated herein by reference. The PCT International Application was published in the Japanese language.

TECHNICAL FIELD

The present invention relates to a substrate processing method and a substrate processing apparatus that process a substrate. Examples of substrates to be processed include a semiconductor wafer, a substrate for a liquid crystal display, a substrate for an optical disc, a substrate for a magnetic disk, a substrate for a magneto-optical disc, a substrate for a photomask, a ceramic substrate, a substrate for a solar cell, a substrate for FPD (a flat panel display) such as an organic EL (electroluminescence) display, and the like.

BACKGROUND ART

Patent Literature 1 discloses that mixed solution including ammonia water and hydrogen peroxide water is brought into contact with an object including a surface to be processed and having a hole portion such as via hole. After the mixed solution is brought into contact with the object, at least one of pressurized vaper or water is applied to the surface to be processed. It is disclosed that this removes unwanted matters remaining on the side wall and the bottom portion of the hole portion such as reaction by-products or residues.

CITATION LIST

Patent Literature

Patent Literature 1: JP 2006186081 A

SUMMARY OF INVENTION

Technical Problem

In the processing method and the processing apparatus disclosed in Patent Literature 1, the mixed solution includes not only ammonia water but also hydrogen peroxide water. When the hydrogen peroxide water contained in the mixed solution reacts with the unwanted matters in the hole portion, a great amount of gas is produced from hydrogen peroxide and a large number of bubbles are formed in the hole portion. The bubbles generated in the hole portion flow toward the entrance of the hole portion, that is, the opening portion of the hole portion. Thus, the entrance of the hole portion may be clogged with the bubbles.

If there are many bubbles at the entrance of the hole portion, it becomes difficult for the mixed solution to reach the bottom of the hole portion. Furthermore, even if the mixed solution reaches the bottom of the hole portion, it is difficult to replace the mixed solution on the bottom of the hole portion with the new mixed solution. Thus, the unwanted matters may remain on the bottom of the hole portion. Especially, in a case where the side wall and the bottom portion of the hole portion are hydrophobic, the mixed solution is difficult to be uniformly supplied to the side wall of the hole portion and so on, and thus the residual amount of the unwanted matters tends to increase.

Thus, an object of the present invention is to provide a substrate processing method and a substrate processing apparatus that are able to effectively etch unwanted matters in a recess portion provided in a substrate and to decrease the unwanted matters remaining in the recess portion.

Solution to Problem

An embodiment of the present invention provides a substrate processing method including a natural oxidation film removing step of removing a natural oxidation film of a group 14 element exposed at a side surface of a recess portion provided in a substrate and exposing a thin film of the group 14 element at the side surface of the recess portion, an IPA supplying step of bringing liquid IPA into contact with the thin film of the group 14 element after the natural oxidation film of the group 14 element is removed, and an ammonia water supplying step of supplying ammonia water to the substrate and etching the thin film of the group 14 element after the IPA comes into contact with the thin film of the group 14 element.

According to this method, the natural oxidation film of the group 14 element such as silicon or germanium is exposed at the side surface of the recess portion provided in the substrate. When this natural oxidation film is removed, the thin film of the group 14 element is exposed at the side surface of the recess portion. A surface of the thin film of the group 14 element is a hydrophobic surface that is not covered with the natural oxidation film of the group 14 element. However, since IPA includes an isopropyl group, when IPA is supplied to the substrate, IPA spreads over the thin film of the group 14 element.

The ammonia water is supplied to the substrate after IPA comes into contact with the thin film of the group 14 element. Since the group 14 element is coated with IPA including a hydroxy group, the ammonia water spreads over the thin film of the group element. Furthermore, although gas is produced when an ammonium hydroxide contained in the ammonia water reacts with the group 14 element, since the thin film of the group 14 element is coated with IPA, the reaction between the ammonium hydroxide and the group 14 element is inhibited by IPA and an amount of gas generated per unit time is decreased.

Since the amount of gas generated per unit time is small, the number of bubbles generated per unit time is small. Or only small bubbles can be generated. When the bubbles are small, the bubbles easily come out of the recess portion via the entrance of the recess portion. Thus, the recess portion is hard to be clogged with the bubbles. Similarly, when the number of generated bubbles is small, the recess portion is hard to be clogged with the bubbles. Furthermore, the flow of the ammonia water that enters and comes out of the recess portion is hard to be disturbed by the bubbles and thus it is possible to effectively replace the ammonia water in the recess portion with the new ammonia water.

As described above, since the ammonia water is supplied to the substrate in a state where IPA is adhered to the thin film of the group 14 element, it is possible to spread the ammonia water over the thin film of the group 14 element even after the natural oxidation film is removed. Furthermore, since the amount of gas generated per unit time can be reduced, it is possible to maintain a state where the ammonia water is uniformly supplied to the thin film of the group 14 element and to continue supplying the highly active ammonia water to the thin film of the group 14 element. Thus, it is possible to effectively etch the group 14 element in the recess portion and to reduce the group 14 element remaining in the recess portion.

The thin film of the group 14 element may be a thin film of single crystal of the group 14 element or a thin film of poly crystal of the group 14 element, or may be a thin film of the amorphous group 14 element. The thin film of the group 14 element may be a thin film consisting of the group 14 element, that is, a thin film in which the percentage of the group 14 element is 100%. As long as the percentage of the group 14 element is approximately 100%, an additive other than the group 14 element may be contained in the thin film of the group 14 element.

In the present embodiment, at least one of the following features may be added to the substrate processing method.

The IPA supplying step includes a liquid film holding step of holding a liquid film of the IPA at an entire front surface of the substrate while rotating the substrate around a rotation axis perpendicular to a central portion of the substrate at a first rotation speed lower than a second rotation speed, and the ammonia water supplying step includes an ammonia water discharge starting step of starting discharging the ammonia water to be supplied to the substrate while increasing rotation speed of the substrate from the first rotation speed to the second rotation speed, and an ammonia water discharge continuing step of continuing discharging the ammonia water while keeping the rotation speed of the substrate at the second rotation speed after the ammonia water discharge starting step.

According to this method, the ammonia water is discharged toward a liquid landing position within the front surface of the substrate in a state where the entire front surface of the substrate is covered with the liquid film of IPA. IPA on the liquid landing position is washed away around the liquid landing position by the ammonia water that has landed on the front surface of the substrate. Thus, an almost circular liquid film of the ammonia water is formed on the front surface of the substrate. On the other hand, the liquid film of IPA changes into an annular shape surrounding the liquid film of the ammonia water. When the discharge of the ammonia water continues, the outer circumferential portion of the liquid film of the ammonia water spreads outward and the entire front surface of the substrate is covered with the liquid film of the ammonia water.

When the substrate starts to rotate at high speed before starting discharging the ammonia water, IPA may flow from the front surface central portion of the substrate to around it before supplying the ammonia water to the substrate, and it may cause the front surface central portion of the substrate to be exposed from the liquid film of IPA. Meanwhile, when both of IPA and the ammonia water exist on the substrate and the rotation speed of the substrate is too low, the front surface outer circumferential portion of the substrate may be partially exposed. This is because Marangoni convection, in which IPA on the substrate flows inward toward the ammonia water on the substrate, occurs.

In the ammonia water supplying step, the discharge of the ammonia water is started while raising the rotation speed of the substrate from the first rotation speed to the second rotation speed, and the discharge of the ammonia water is continued while keeping the rotation speed of the substrate at the second rotation speed. Since the rotation speed of the substrate is low when starting discharging the ammonia water, the front surface central portion of the substrate is not exposed from the liquid film of IPA before supplying the ammonia water. Furthermore, since the centrifugal force applied to IPA and the ammonia water on the substrate gradually increases, the front surface central portion of the substrate is also not exposed from the liquid film of IPA due to Marangoni convection. Thus, it is possible to replace IPA on the substrate with the ammonia water while maintaining a state where the entire front surface of the substrate is covered with the liquid film.

As long as the front surface outer circumferential portion of the substrate is not partially exposed, the time when the discharge of the ammonia water is started may be before the time when the acceleration of the substrate is started. However, in this case, the amount of IPA on the substrate is almost unchanged between the time when the discharge of the ammonia water is started and the time before the discharge of the ammonia water is started. In contrast, in a case where the discharge of the ammonia water is started while raising the rotation speed of the substrate from the first rotation speed to the second rotation speed, IPA is removed due to the centrifugal force and the amount of IPA on the substrate decreases after the acceleration of the substrate is started and before the ammonia water is supplied to the substrate.

The ammonia water is mixed with IPA on the substrate. The concentration of ammonia contained in the liquid on the substrate lowers as the amount of IPA on the substrate increases. It is possible to decrease the decrease amount of the concentration of ammonia as compared with a case where the discharge of the ammonia water is started before the acceleration of the substrate is started and to shorten the time required to etch the group 14 element by staring discharging the ammonia water while raising the rotation speed of the substrate from the first rotation speed to the second rotation speed. Thus, it is preferable to start discharging the ammonia water while accelerating the substrate in the rotation direction.

In the substrate processing method, a cycle including the IPA supplying step and the ammonia water supplying step is performed a plurality of times.

According to this method, IPA and the ammonia water are supplied to the substrate in this order, and then IPA and the ammonia water are supplied again to the substrate in this order. IPA adhering to the thin film of the group 14 element gradually decreases due to the supply of the ammonia water. It is possible to replenish IPA to the thin film of the group 14 element by supplying again IPA to the substrate. Thus, it is possible to spread the ammonia water over the thin film of the group 14 element.

The ammonia water supplying step includes at least one of an accelerating step of raising rotation speed of the substrate in a state where an entire front surface of the substrate is covered with a liquid film of the ammonia water and a flow rate increasing step of increasing a flow rate of the ammonia water discharged toward the front surface of the substrate in a state where the entire front surface of the substrate is covered with the liquid film of the ammonia water.

According to this method, the rotation speed of the substrate is raised while holding the liquid film of the ammonia water on the front surface of the substrate. Or the flow rate of the ammonia water discharged toward the front surface of the substrate is increased while holding the liquid film of the ammonia water on the front surface of the substrate. Or both of the acceleration of the substrate in the rotation direction and the increase in the discharge flow rate of the ammonia water are performed while holding the liquid film of the ammonia water on the front surface of the substrate.

When the rotation speed of the substrate rises, the centrifugal force applied to the liquid on the substrate increases and the flow speed of the liquid at the substrate rises. Similarly, when the flow rate of the liquid discharged toward the front surface of the substrate increases, the flow speed of the liquid at the substrate rises. Thus, it is possible to raise the flow speed of the ammonia water at the substrate and to drive the removal of the bubbles from the recess portion by performing at least one of the acceleration of the substrate in the rotation direction and the increase in the discharge flow rate of the ammonia water. Therefore, it is possible to suppress or prevent the recess portion from being clogged with the bubbles.

The ammonia water supplying step includes a routine performing step of performing one or more times a routine including a first accelerating step of raising rotation speed of the substrate in a state where a liquid film of the ammonia water exists on a front surface of the substrate, a first decelerating step of lowering, after the first accelerating step, the rotation speed of the substrate in a state where the liquid film of the ammonia water exists on the front surface of the substrate, and a second accelerating step of raising, after the first decelerating step, the rotation speed of the substrate in a state where the liquid film of the ammonia water exists on the front surface of the substrate.

According to this method, the rotation speed of the substrate is raised in a state where the front surface of the substrate is covered with the liquid film of the ammonia water (the first accelerating step). After that, the rotation speed of the substrate is lowered in a state where the front surface of the substrate is covered with the liquid film of the ammonia water (the first decelerating step). After that, the rotation speed of the substrate is raised in a state where the front surface of the substrate is covered with the liquid film of the ammonia water (the second accelerating step). The first accelerating step, the first decelerating step, and the second accelerating step are performed again in this order, as appropriate.

When the rotation speed of the substrate rises, the centrifugal force applied to the liquid on the substrate increases and the flow speed of the liquid at the substrate rises. Furthermore, when the rotation speed of the substrate is kept constant, an almost stable liquid flow is formed on the substrate, whereas when the rotation speed of the substrate is changed, a liquid flow on the substrate changes. Thus, it is possible to drive the removal of the bubbles from the recess portion by accelerating and decelerating in the rotation direction instead of continuing rotating the substrate at high speed.

The ammonia water supplying step includes a routine performing step of performing one or more times a routine including a first flow rate increasing step of increasing a flow rate of the ammonia water discharged toward a front surface of the substrate in a state where a liquid film of the ammonia water exists on the front surface of the substrate, a first flow rate decreasing step of decreasing, after the first flow rate increasing step, the flow rate of the ammonia water discharged toward the front surface of the substrate in a state where the liquid film of the ammonia water exists on the front surface of the substrate, and a second flow rate increasing step of increasing, after the first decelerating step, the flow rate of the ammonia water discharged toward the front surface of the substrate in a state where the liquid film of the ammonia water exists on the front surface of the substrate.

According to this method, the discharge flow rate of the ammonia water is increased in a state where the front surface of the substrate is covered with the liquid film of the ammonia water (the first flow rate increasing step). After that, the discharge flow rate of the ammonia water is decreased in a state where the front surface of the substrate is covered with the liquid film of the ammonia water (the first flow rate decreasing step). After that, the discharge flow rate of the ammonia water is increased in a state where the front surface of the substrate is covered with the liquid film of the ammonia water (the second flow rate increasing step). The first flow rate increasing step, the first flow rate decreasing step, and the second flow rate increasing step are performed again in this order, as appropriate.

When the flow rate of the liquid discharged toward the front surface of the substrate increases, the flow speed of the liquid at the substrate rises. Furthermore, when the discharge flow rate of the liquid is kept constant, an almost stable liquid flow is formed on the substrate, whereas when the discharge flow rate of the liquid is changed, a liquid flow on the substrate changes. Thus, it is possible to drive the removal of the bubbles from the recess portion by changing the ammonia water instead of continuing discharging the ammonia water at a high flow rate The substrate processing method further includes a closing step of causing a facing surface having an outer diameter equal to or larger than a diameter of the substrate to face a front surface of the substrate and causing an upper end of a tubular guard surrounding the substrate to be located at a height equal to the facing surface or at a height higher than the facing surface while horizontally holding the substrate with the front surface of the substrate directed upward when at least one of the IPA supplying step and the ammonia water supplying step is being performed.

According to this method, the facing surface having the outer diameter equal to or larger than the diameter of the substrate is opposed to the upper surface of the substrate, that is, the front surface of the substrate. Furthermore, the upper end of the tubular guard surrounding the substrate is located at the height equal to the facing surface or at the height higher than the facing surface. The upper surface of the substrate is protected by the facing surface. The outer circumferential surface of the substrate is protected by the guard. Furthermore, the space between the substrate and the facing surface is surrounded by the guard and thus the sealing property of this space can be improved. Thus, it is possible to process the substrate while protecting the substrate from an atmosphere including particles.

The thin film of the group 14 element extends from an entrance of the recess portion toward a bottom of the recess portion.

According to this method, a portion of the thin film of the group 14 element is disposed at the entrance of the recess portion. When ammonium hydroxide contained in the ammonia water reacts with the group 14 element, gas is produced. Thus, gas is produced at the entrance of the recess portion. Furthermore, the bubbles generated in the recess portion flow toward the entrance of the recess portion. However, since the thin film of the group element is coated with IPA before the ammonia water is supplied to the substrate, it is possible to reduce an amount of gas generated per unit time and to suppress or prevent the entrance of the recess portion from being clogged with the bubbles.

The side surface of the recess portion includes a pair of opposing portions that face each other in a width direction perpendicular to a depth direction of the recess portion, and a length of the thin film of the group 14 element in the depth direction of the recess portion is longer than a gap between the pair of opposing portions in the width direction of the recess portion.

According to this method, the thin film of the group 14 element is disposed at a wide range of the side surface of the recess portion. Thus, the amount of gas, which is generated when etching the group 14 element, increases. Furthermore, since the group 14 element is long in the depth direction of the recess portion, the bottom surface of the thin film of the group 14 element approaches the bottom surface of the recess portion at which the ammonia water is hard to arrive as compared to the entrance of the recess portion. However, since the thin film of the group 14 element is coated with IPA before the ammonia water is supplied to the substrate, it is possible to reduce an amount of gas generated per unit time and to suppress or prevent the entrance of the recess portion from being clogged with the bubbles.

Another embodiment of the present invention provides a substrate processing apparatus including a natural oxidation film removing unit that removes a natural oxidation film of a group 14 element exposed at a side surface of a recess portion provided in a substrate and exposes a thin film of the group 14 element at the side surface of the recess portion, an IPA supplying unit that brings liquid IPA into contact with the thin film of the group 14 element, an ammonia water supplying unit that supplies ammonia water to the substrate and etches the thin film of the group 14 element, and a controller that controls the natural oxidation film removing unit, the IPA supplying unit, and the ammonia water supplying unit.

The controller performs a natural oxidation film removing step of removing the natural oxidation film of the group 14 element exposed at the side surface of the recess portion provided in the substrate and exposing the thin film of the group 14 element at the side surface of the recess portion, a IPA supplying step of bringing the liquid IPA into contact with the thin film of the group 14 element after the natural oxidation film of the group 14 element is removed, and an ammonia water supplying step of supplying the ammonia water to the substrate and etching the thin film of the group 14 element after the IPA comes into contact with the thin film of the group 14 element. According to this arrangement, the same effects as the effects described above can be obtained.

In the present embodiment, at least one of the following features may be added to the substrate processing apparatus.

The substrate processing apparatus further includes a substrate rotating unit that rotates the substrate around a rotation axis perpendicular to a central portion of the substrate. The controller controls the natural oxidation film removing unit, the IPA supplying unit, the ammonia water supplying unit, and the substrate rotating unit. The IPA supplying step includes a liquid film holding step of holding a liquid film of the IPA at an entire front surface of the substrate while rotating the substrate at a first rotation speed lower than a second rotation speed, and the ammonia water supplying step includes an ammonia water discharge starting step of starting discharging the ammonia water to be supplied to the substrate while increasing rotation speed of the substrate from the first rotation speed to the second rotation speed, and an ammonia water discharge continuing step of continuing discharging the ammonia water while keeping the rotation speed of the substrate at the second rotation speed after the ammonia water discharge starting step. According to this arrangement, the same effects as the effects described above can be obtained.

The controller performs a cycle including the IPA supplying step and the ammonia water supplying step a plurality of times. According to this arrangement, the same effects as the effects described above can be obtained.

The substrate processing apparatus further includes a substrate rotating unit that rotates the substrate around a rotation axis perpendicular to a central portion of the substrate and a flow rate control valve that changes a flow rate of the ammonia water discharged toward a front surface of the substrate. The controller controls the natural oxidation film removing unit, the IPA supplying unit, the ammonia water supplying unit, the substrate rotating unit, and the flow rate control valve. The ammonia water supplying step includes at least one of an accelerating step of raising rotation speed of the substrate in a state where an entire front surface of the substrate is covered with a liquid film of the ammonia water and a flow rate increasing step of increasing the flow rate of the ammonia water discharged toward the front surface of the substrate in a state where the entire front surface of the substrate is covered with the liquid film of the ammonia water. According to this arrangement, the same effects as the effects described above can be obtained.

The substrate processing apparatus further includes a substrate rotating unit that rotates the substrate around a rotation axis perpendicular to a central portion of the substrate. The controller controls the natural oxidation film removing unit, the IPA supplying unit, the ammonia water supplying unit, and the substrate rotating unit. The ammonia water supplying step includes a routine performing step of performing one or more times a routine including a first accelerating step of raising rotation speed of the substrate in a state where a liquid film of the ammonia water exists on a front surface of the substrate, a first decelerating step of lowering, after the first accelerating step, the rotation speed of the substrate in a state where the liquid film of the ammonia water exists on the front surface of the substrate, and a second accelerating step of raising, after the first decelerating step, the rotation speed of the substrate in a state where the liquid film of the ammonia water exists on the front surface of the substrate. According to this arrangement, the same effects as the effects described above can be obtained.

The substrate processing apparatus further includes a flow rate control valve that changes a flow rate of the ammonia water discharged toward a front surface of the substrate. The controller controls the natural oxidation film removing unit, the IPA supplying unit, the ammonia water supplying unit, and the flow rate control valve. The ammonia water supplying step includes a routine performing step of performing one or more times a routine including a first flow rate increasing step of increasing the flow rate of the ammonia water discharged toward the front surface of the substrate in a state where a liquid film of the ammonia water exists on the front surface of the substrate, a first flow rate decreasing step of decreasing, after the first flow rate increasing step, the flow rate of the ammonia water discharged toward the front surface of the substrate in a state where the liquid film of the ammonia water exists on the front surface of the substrate, and a second flow rate increasing step of increasing, after the first decelerating step, the flow rate of the ammonia water discharged toward the front surface of the substrate in a state where the liquid film of the ammonia water exists on the front surface of the substrate. According to this arrangement, the same effects as the effects described above can be obtained.

The substrate processing apparatus further includes a substrate holding unit that horizontally holds the substrate with a front surface of the substrate directed upward, a facing surface that has an outer diameter equal to or larger than a diameter of the substrate and that faces the front surface of the substrate, and a tubular guard that includes an upper end located at a height equal to the facing surface or at a height higher than the facing surface and that surrounds the substrate.

The controller further performs a closing step of causing the facing surface to face the front surface of the substrate and causing the upper end of the guard to be located at the height equal to the facing surface or at the height higher than the facing surface while horizontally holding the substrate with the front surface of the substrate directed upward when at least one of the IPA supplying step and the ammonia water supplying step is being performed. According to this arrangement, the same effects as the effects described above can be obtained.

The above and other elements, features, steps, characteristics and advantages of the present invention will become more apparent from the following detailed description of the embodiments with reference to the attached drawings.

BRIEF DESCRIPTION OF THE DRAWINGS

FIG. 7 a time chart showing operations of the substrate processing apparatus when the example of the processing of the substrate shown in FIG. 4 is being performed.

FIG. 8 a schematic view showing cross-sections of the substrate in cases where IPA is supplied and IPA is not supplied after DHF is supplied and before the diluted ammonia water is supplied.

FIG. 9 a schematic view showing appearances of the liquid film on the substrate when the discharge of the diluted ammonia water is started while rotating the substrate at high speed.

FIG. 10 a schematic view showing appearances of the liquid film on the substrate when the discharge of the diluted ammonia water is started while rotating the substrate at low speed.

FIG. 11 a time chart showing operations of the substrate processing apparatus when another example of processing the substrate is being performed.

FIG. 14 a time chart showing operations of the substrate processing apparatus when another example of processing the substrate is being performed.

DETAILED DESCRIPTION OF THE PREFERRED EMBODIMENTS

Figure 1:
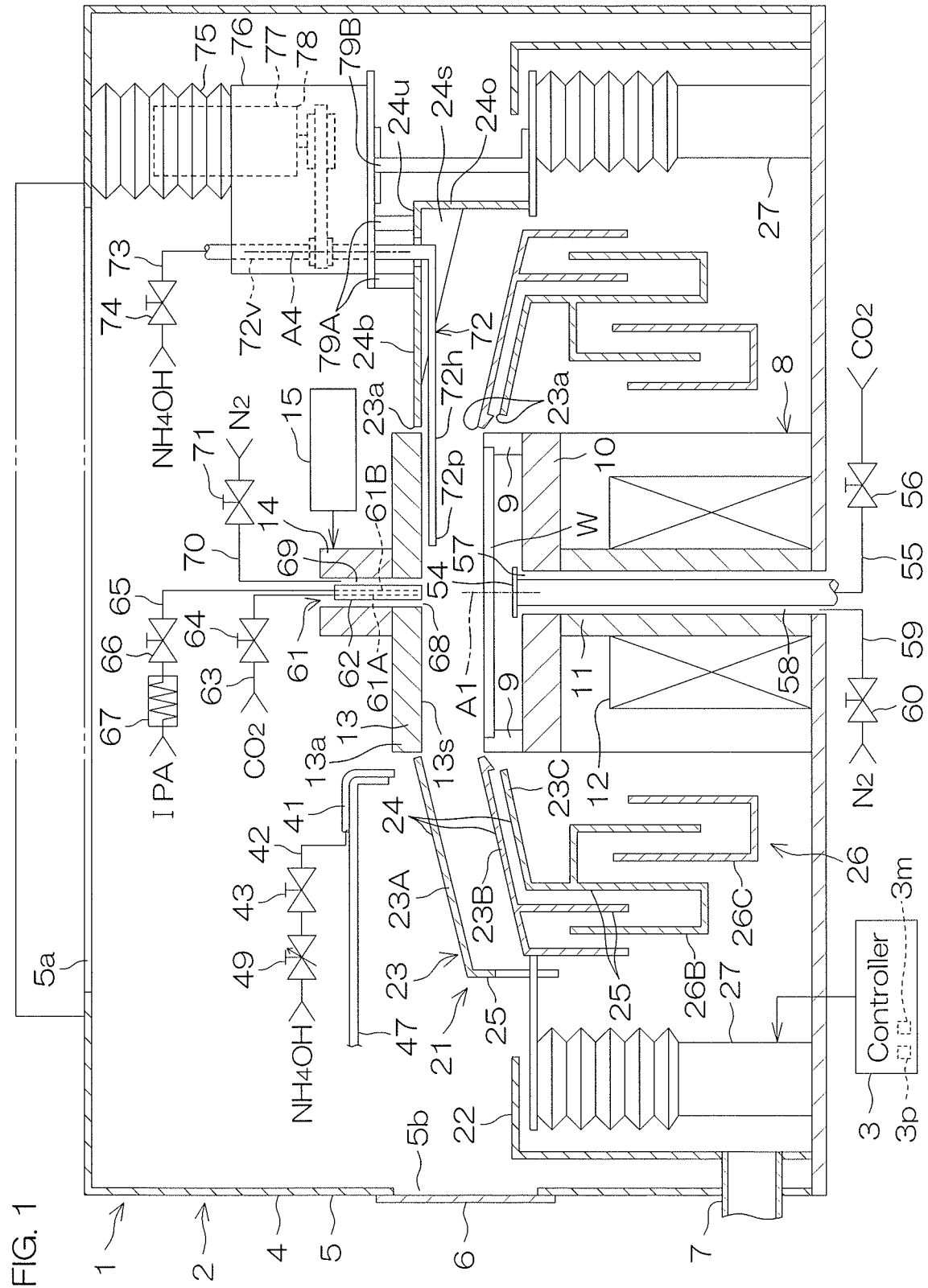
FIG. 1 a schematic view of the inside of a processing unit included in a substrate processing apparatus according to a first embodiment of the present invention when viewed horizontally.
Figure 2:
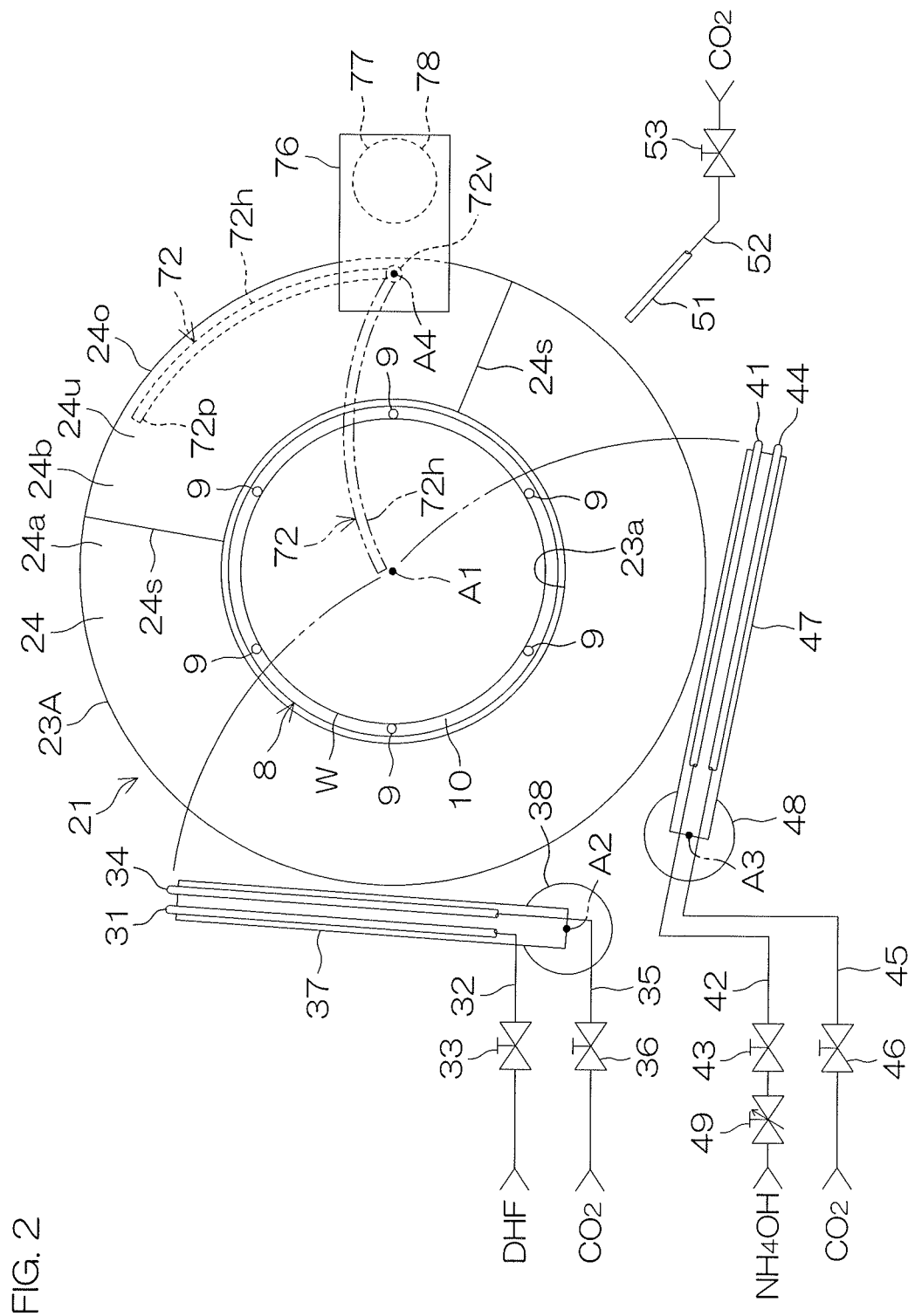
FIG. 2 a schematic view of a spin chuck and a processing cup when viewed from above.

FIG. 1 is a schematic view of the inside of a processing unit 2 included in a substrate processing apparatus 1 according to a first embodiment of the present invention when viewed horizontally. FIG. 2 is a schematic view of a spin chuck 8 and a processing cup 21 when viewed from above.

As shown in FIG. 1, the substrate processing apparatus 1 is a single substrate processing type apparatus which processes disc-shaped substrates W such as a semiconductor wafer one by one. The substrate processing apparatus 1 includes load ports (not shown) on which box-shaped carriers to house substrates W are placed, processing units 2 which process the substrates W transferred from the carriers on the load ports with a processing fluid such as a processing liquid or a processing gas, a transfer robot (not shown) which transfers the substrate W between the load ports and the processing units 2, and a controller 3 which controls the substrate processing apparatus 1.

The processing unit 2 includes a box-shaped chamber 4 which has an inner space, the spin chuck 8 which rotates a substrate W around a vertical rotation axis A1 passing through a central portion of the substrate W while holding the substrate W horizontally inside the chamber 4, a shielding member 13 which faces an upper surface of the substrate W held by the spin chuck 8, and the tubular processing cup 21 which receives a processing liquid discharged outward from the substrate W and the spin chuck 8.

The chamber 4 includes a box-shaped partition wall 5 having a carry-in/carry-out port 5b through which the substrate W passes and a shutter 6 which opens and closes the carry-in/carry-out port 5b. Clean air, which is filtered air, is constantly supplied into the chamber 4 from a ventilation port 5a provided at an upper portion of the partition wall 5. A gas inside the chamber 4 is discharged from the chamber 4 through an exhaust duct 7 connected to a bottom portion of the processing cup 21. Thereby, a downflow of the clean air is constantly formed inside the chamber 4.

The spin chuck 8 includes a disc-shaped spin base 10 which is held in a horizontal posture, a plurality of chuck pins 9 which hold the substrate W in a horizontal posture above the spin base 10, a spin shaft 11 which extends below from a central portion of the spin base 10, and a spin motor 12 which rotates the spin base 10 and the plurality of chuck pins 9 by rotating the spin shaft 11. The spin chuck 8 is not limited to a clamping type chuck which brings the plurality of chuck pins 9 into contact with an outer circumferential surface of the substrate W but may be a vacuum type chuck which holds the substrate W horizontally by allowing a rear surface (lower surface) of the substrate W as a non-device forming surface to be adsorbed on an upper surface of the spin base 10.

The shielding member 13 is disposed above the spin chuck 8. The shielding member 13 is a circular plate portion 13a greater in outer diameter than the substrate W. The shielding member 13 is supported in a horizontal posture by a support shaft 14 which extends in an up-down direction. A center line of the shielding member 13 is disposed on the rotation axis A1. A lower surface 13s of the shielding member 13 is larger in outer diameter than the substrate W. The lower surface 13s of the shielding member 13 is parallel with the upper surface of the substrate W and faces the upper surface of the substrate W. The lower surface 13s of the shielding member 13 is one example of the facing surface which faces the upper surface of the substrate W.

The processing unit 2 includes a shielding member elevating/lowering unit 15 which is coupled to the shielding member 13 via the support shaft 14. The processing unit 2 may include a shielding member rotating unit which rotates the shielding member 13 around the center line of the shielding member 13. The shielding member elevating/lowering unit 15 elevates and lowers the shielding member 13 between a lower position (refer to FIG. 6E) where the lower surface 13s of the shielding member 13 is close to the upper surface of the substrate W such that a scan nozzle such as the first chemical liquid nozzle 31 is unable to enter between the upper surface of the substrate W and the lower surface 13s of the shielding member 13, and an upper position (refer to FIG. 5A)) where the lower surface 13s of the shielding member 13 is away upward from the upper surface of the substrate W such that the scan nozzle is able to enter between the upper surface of the substrate W and the lower surface 13s of the shielding member 13. The shielding member elevating/lowering unit 15 locates the shielding member 13 at any position from the lower position to the upper position.

The processing cup 21 includes a plurality of guards 23 which receive a liquid discharged outward from the spin chuck 8, a plurality of cups 26 which receive the liquid guided downward by the plurality of guards 23, and a cylindrical outer wall member 22 which surrounds the plurality of guards 23 and the plurality of cups 26. FIG. 1 shows an example in which three guards 23 (a first guard 23A, a second guard 23B and a third guard 23C) and two cups 26 (a second cup 26B and a third cup 26C) are provided.

Where a reference is made to each of the first guard 23A, the second guard 23B and the third guard 23C, they are hereinafter simply referred to as the guard 23. Similarly, where a reference is made to each of the second cup 26B and the third cup 26C, they are simply referred to as the cup 26. Further, there is a case that "first" is added to the beginning of a configuration corresponding to the first guard 23A. There is, for example, a case that the tubular portion 25 corresponding to the first guard 23A is referred to as a "first tubular portion 25." This is also similar to a configuration corresponding to each of the second guard 23B to the third guard 23C.

The guard 23 includes a cylindrical tubular portion 25 which surrounds the spin chuck 8 and a circular-annular ceiling portion 24 which extends obliquely upward from an upper end portion of the tubular portion 25 toward the rotation axis A1. The first ceiling portion 24 to the third ceiling portion 24 are overlapped in the up-down direction in the order of the first ceiling portion 24 to the third ceiling portion 24 from above. The first tubular portion 25 to the third tubular portion 25 are disposed concentrically in the order of the first tubular portion 25 to the third tubular portion 25 from the outside. Upper ends of the first ceiling portion 24 to the third ceiling portion 24 correspond to upper ends 23a of the first guard 23A to the third guard 23C, respectively. The upper ends of the first ceiling portion 24 to the third ceiling portion 24 surround the spin base 10 and the shielding member 13 in a plan view.

The plurality of cups 26 are disposed concentrically in the order of the second cup 26B and the third cup 26C from the outside. The third cup 26C surrounds the spin chuck 8. The third cup 26C is disposed below the upper end of the outer wall member 22. The third cup 26C is fixed with respect to the partition wall 5 of the chamber 4. The second cup 26B is integral with the second guard 23B and moves together with the second guard 23B in the up-down direction. The second guard 23B may be movable in relation to the second cup 26B.

The guard 23 is able to move in the up-down direction between an upper position at which the upper end 23a of the guard 23 is disposed above a substrate holding position at which the substrate W held by the spin chuck 8 is disposed and a lower position at which the upper end 23a of the guard 23 is disposed below the substrate holding position. The processing unit 2 includes a guard elevating/lowering unit 27 which moves individually the plurality of guards 23 in the up-down direction. The guard elevating/lowering unit 27 locates the guard 23 at any position from the upper position to the lower position. The guard elevating/lowering unit 27 includes, for example, an electric motor which generates power to move the guard 23 in the up-down direction as well as a ball screw and a ball nut which convert the rotation of the electric motor to the vertical movement of the guard 23.

As shown in FIG. 2, the processing unit 2 includes a first chemical liquid nozzle 31 which discharges a chemical liquid downward toward the upper surface of the substrate W and a first rinse liquid nozzle 34 which discharges a rinse liquid downward toward the upper surface of the substrate W. The first chemical liquid nozzle 31 is connected to a first chemical liquid piping 32 which guide the chemical liquid, and the first rinse liquid nozzle 34 is connected to a first rinse liquid piping 35 which guide the rinse liquid. When a first chemical liquid valve 33 which is placed on the first chemical liquid piping 32 is opened, the chemical liquid is discharged continuously downward from a discharge port of the first chemical liquid nozzle 31. Similarly, when a first rinse liquid valve 36 which is placed on the first rinse liquid piping 35 is opened, the rinse liquid is discharged continuously downward from a discharge port of the first rinse liquid nozzle 34.

The chemical liquid to be discharged from the first chemical liquid nozzle 31 is DHF (diluted hydrofluoric acid), for example. DHF is a solution in which hydrofluoric acid is diluted by water. The chemical liquid may be a liquid other than DHF, as long as it can remove the natural oxidation film of the group 14 element such as silicon. The rinse liquid to be discharged from the first rinse liquid nozzle 34 is carbonated water, for example. The rinse liquid may be any one of pure water (Deionized Water), electrolyzed ion water, hydrogen water, ozone water, and hydrochloric acid water of a diluted concentration (e.g., approximately 10 to 100 ppm).

Although not shown, the first chemical liquid valve 33 includes a valve body which defines a flow channel, a valve element which is disposed inside the flow channel and an actuator which moves the valve element. This applies to other valves. The actuator may be a pneumatic actuator or an electric actuator or may be an actuator other than these. The controller 3 opens or closes the first chemical liquid valve 33 by controlling the actuator. In a case where the actuator is the electric actuator, the controller 3 locates the valve element at any position from a fully closed position to a fully open position by controlling the electric actuator.

The first chemical liquid nozzle 31 and the first rinse liquid nozzle 34 are scan nozzles which can move inside the chamber 4. The processing unit 2 includes a first nozzle arm 37 which holds the first chemical liquid nozzle 31 and the first rinse liquid nozzle 34 and a first nozzle movement unit 38 which moves the first chemical liquid nozzle 31 and the first rinse liquid nozzle 34 at least in one of the vertical direction and the horizontal direction by moving the first nozzle arm 37.

The first nozzle movement unit 38 horizontally moves the first chemical liquid nozzle 31 and the first rinse liquid nozzle 34 between a processing position (refer to FIG. 5A) where the processing liquid discharged from the first chemical liquid nozzle 31 and the first rinse liquid nozzle 34 lands on the upper surface of the substrate W and a standby position (a position shown in FIG. 2) where the first chemical liquid nozzle 31 and the first rinse liquid nozzle 34 are located around the spin chuck 8 in a plan view. The first nozzle movement unit 38 is a turning unit which horizontally moves the first chemical liquid nozzle 31 and the first rinse liquid nozzle 34 about a nozzle turning axis A2 vertically extending at a space around the spin chuck 8 and the processing cup 21, for example.

The processing unit 2 includes a second chemical liquid nozzle 41 which discharges a chemical liquid downward toward the upper surface of the substrate W and a second rinse liquid nozzle 44 which discharges a rinse liquid downward toward the upper surface of the substrate W. The second chemical liquid nozzle 41 is connected to a second chemical liquid piping 42 which guide the chemical liquid, and the second rinse liquid nozzle 44 is connected to a second rinse liquid piping 45 which guide the rinse liquid. When a second chemical liquid valve 43 which is placed on the second chemical liquid piping 42 is opened, the chemical liquid is discharged continuously downward from a discharge port of the second chemical liquid nozzle 41. Similarly, when a second rinse liquid valve 46 which is placed on the second rinse liquid piping 45 is opened, the rinse liquid is discharged continuously downward from a discharge port of the second rinse liquid nozzle 44.

The chemical liquid to be discharged from the second chemical liquid nozzle 41 is the diluted ammonia water, for example. The concentration of ammonia in the diluted ammonia water is 2.0 to 3.0 wt % (for example, 2.5 wt %). The concentration of ammonia in the diluted ammonia water may be a value other than this. The rinse liquid to be discharged from the second rinse liquid nozzle 44 is the carbonated water, for example. The rinse liquid to be discharged from the second rinse liquid nozzle 44 may be the above described rinse liquid other than the carbonated water.

The substrate processing apparatus 1 includes a second flow rate control valve 49 which changes a flow rate of the chemical liquid to be supplied the second chemical liquid piping 42 to the second chemical liquid nozzle 41. Although not shown, flow rate control valves corresponding to other nozzles are also provided in the substrate processing apparatus 1. The second flow rate control valve 49 is placed on the second chemical liquid piping 42. The chemical liquid is supplied from the second chemical liquid piping 42 to the second chemical liquid nozzle 41 at a flow rate corresponding to the opening degree of the second flow rate control valve 49 and discharged from the second chemical liquid nozzle 41 at this flow rate. The opening degree of the second flow rate control valve 49 is changed by the controller 3.

The second chemical liquid nozzle 41 and the second rinse liquid nozzle 44 are scan nozzles which can move inside the chamber 4. The processing unit 2 includes a second nozzle arm 47 which holds the second chemical liquid nozzle 41 and the second rinse liquid nozzle 44 and a second nozzle movement unit 48 which moves the second chemical liquid nozzle 41 and the second rinse liquid nozzle 44 at least in one of the vertical direction and the horizontal direction by moving the second nozzle arm 47.

The second nozzle movement unit 48 horizontally moves the second chemical liquid nozzle 41 and the second rinse liquid nozzle 44 between a processing position (refer to FIG. 6A) where the processing liquid discharged from the second chemical liquid nozzle 41 and the second rinse liquid nozzle 44 lands on the upper surface of the substrate W and a standby position (a position shown in FIG. 2) where the second chemical liquid nozzle 41 and the second rinse liquid nozzle 44 are located around the spin chuck 8 in a plan view. The second nozzle movement unit 48 is a turning unit which horizontally moves the second chemical liquid nozzle 41 and the second rinse liquid nozzle 44 about a nozzle turning axis A3 vertically extending at a space around the spin chuck 8 and the processing cup 21, for example.

The processing unit 2 includes a fixed nozzle 51 which discharges the processing liquid downward toward the upper surface of the substrate W. The fixed nozzle 51 is connected to a third rinse liquid piping 52 which guide the rinse liquid. When a third rinse liquid valve 53 which is placed on the third rinse liquid piping 52 is opened, the rinse liquid is discharged continuously downward from a discharge port of the fixed nozzle 51. The rinse liquid to be discharged from the fixed nozzle 51 is the carbonated water, for example. The rinse liquid to be discharged from the fixed nozzle 51 may be the above described rinse liquid other than the carbonated water. The processing liquid discharged from the fixed nozzle 51 lands on the upper surface central portion of the substrate W. The fixed nozzle 51 is fixed with respect to the partition wall 5 of the chamber 4.

As shown in FIG. 1, the processing unit 2 includes a lower surface nozzle 54 which discharges the processing liquid upward toward the lower surface central portion of the substrate W. The lower surface nozzle 54 is inserted in a through hole which is open at the upper surface central portion of the spin base 10. A discharge port of the lower surface nozzle 54 is disposed above the upper surface of the spin base 10 and faces the lower surface central portion of the substrate W in the up-down direction. The lower surface nozzle 54 is connected to lower rinse liquid piping 54 on which a lower rinse liquid valve 56 is placed.

When the lower rinse liquid valve 56 is opened, the rinse liquid is supplied from the lower rinse liquid piping 54 to the lower surface nozzle 54 and discharged continuously upward from the discharge port of the lower surface nozzle 54. The rinse liquid to be discharged from the lower surface nozzle 54 is the carbonated water, for example. The rinse liquid to be discharged from the lower surface nozzle 54 may be the above described rinse liquid other than the carbonated water. The lower surface nozzle 54 is fixed with respect to the partition wall 5 of the chamber 4. When the spin chuck 8 rotates the substrate W, the lower surface nozzle 54 does not rotate.

The substrate processing apparatus 1 includes lower gas piping 59 which guide gas from a gas supply source to a lower central opening 57 which is open at the upper surface central portion of the spin base 10, and a lower gas valve 60 which is placed on the lower gas piping 59. When the lower gas valve 60 is opened, gas supplied from the lower gas piping 59 flows upward in a tubular lower gas flow channel 58 defined by an outer circumferential surface of the lower surface nozzle 54 and the inner circumferential surface of the spin base 10 and is discharged upward from the lower central opening 57. The inner circumferential surface of the lower central opening 57 surrounds the rotation axis A1 of the substrate W. The gas to be supplied to the lower central opening 57 is nitrogen gas, for example. The gas may be other inert gas such as helium gas or argon gas, or may be clean air or dry air (dehumidified clean air).

The processing unit 2 includes a central nozzle 61 which discharges processing liquid downward via an upper central opening 68 which is open at a central portion of the lower surface 13s of the shielding member 13. Discharge ports of the central nozzle 61 (discharge ports of a first tube 61A and a second tube 61B described below) which discharge the processing liquid are disposed inside a through hole which vertically penetrates through the central portion of the shielding member 13. The discharge ports of the central nozzle 61 are disposed above the upper central opening 68. An inner circumferential surface of the upper central opening 68 surrounds the rotation axis A1 of the substrate W. The central nozzle 61 is elevated and lowered together with the shielding member 13 in the vertical direction.

The central nozzle 61 includes a plurality of inner tubes (the first tube 61A and the second tube 61B) which discharge the processing liquid downward and a tubular casing 62 which surrounds the plurality of inner tubes. The first tube 61A, the second tube 61B and the casing 62 extend along the rotation axis A1 in the up-down direction. An inner circumferential surface of the shielding member 13 surrounds an outer circumferential surface of the casing 62 across an interval in a radial direction (a direction perpendicular to the rotation axis A1).

The first tube 61A is an example of a rinse liquid nozzle which discharges a rinse liquid downward toward the upper surface of the substrate W. The first tube 61A is connected to upper rinse liquid piping 63 on which an upper rinse liquid valve 64 is placed. When the upper rinse liquid valve 64 is opened, the rinse liquid is supplied from the upper rinse liquid piping 63 to the first tube 61A and discharged downward continuously from the discharge port of the first tube 61A. The rinse liquid to be discharged from the first tube 61A is carbonated water, for example. The rinse liquid to be discharged from the first tube 61A may be the above described rinse liquid other than the carbonated water.

The second tube 61B is an example of a solvent nozzle which discharges liquid IPA (isopropyl alcohol) downward toward the upper surface of the substrate W. The second tube 61B is connected to solvent piping 65 on which a solvent valve 66 is placed. When the solvent valve 66 is opened, IPA is supplied from the solvent piping 65 to the second tube 61B and continuously discharged downward from the discharge port of the second tube 61B. A solvent heater 67 which heats IPA is placed on the solvent piping 65. IPA higher in temperature than room temperature (20 to 30° C.) is supplied to the second tube 61B. IPA is an example of an organic solvent which is lower in surface tension than water and higher in volatility than water. IPA is lower in surface tension than the diluted ammonia water.

The substrate processing apparatus 1 includes upper gas piping 70 which guide gas from a gas supply source to the upper central opening 68 of the shielding member 13 and an upper gas valve 71 which is placed on the upper gas piping 70. When the upper gas valve 71 is opened, gas supplied from the upper gas piping 70 flows downward in a tubular upper gas flow channel 69 defined by an outer circumferential surface of the central nozzle 61 and the inner circumferential surface of the shielding member 13 and is discharged downward from the upper central opening 68. The gas to be supplied to the upper central opening 68 is nitrogen gas, for example. Gas other than nitrogen gas may be supplied to the upper central opening 68.

The processing unit 2 includes an internal nozzle 72 which discharges the processing liquid toward the upper surface of the substrate W. The internal nozzle 72 includes a horizontal portion 72h which is disposed below the upper end 23a of the first guard 23A and a vertical portion 72v which is disposed above the first guard 23A. Even when the first guard 23A and the second guard 23B are disposed at any position, the horizontal portion 72h is disposed between the first guard 23A and the second guard 23B. As shown in FIG. 2, the horizontal portion 72h has a circular-arc shape in a plan view. The horizontal portion 72h may have a linear shape in a plan view or a broken line-shaped configuration in a plan view.

As shown in FIG. 1, the internal nozzle 72 is inserted into a through hole which penetrates through the ceiling portion 24 of the first guard 23A in the up-down direction. The vertical portion 72v is disposed above the through hole of the first guard 23A. The vertical portion 72v penetrates through a housing 76 disposed above the first guard 23A in the up-down direction. The housing 76 is supported by the first guard 23A. The vertical portion 72v is rotatably supported by the housing 76. The internal nozzle 72 is turnable with respect to the first guard 23A around a nozzle turning axis A4 which corresponds to the center line of the vertical portion 72v. The nozzle turning axis A4 is a vertical axis which passes through the first guard 23A.

A discharge port 72p which discharges the processing liquid downward is provided at a tip portion (an end portion opposite to the nozzle turning axis A4) of the horizontal portion 72h. The internal nozzle 72 is connected to third chemical liquid piping 73 on which a third chemical liquid valve 74 is placed. When the third chemical liquid valve 74 is opened, the diluted ammonia water, which is an example of the chemical liquid, is supplied from the third chemical liquid piping 73 to the internal nozzle 72 and continuously discharged downward from the discharge port 72p of the internal nozzle 72. A second solvent heater 64 which heats IPA is placed on the third chemical liquid piping 73.

The processing unit 2 includes a scan unit 77 which turns the internal nozzle 72 around the nozzle turning axis A4 between a processing position at which the processing liquid discharged from the internal nozzle 72 lands on the upper surface of the substrate W and a standby position at which the internal nozzle 72 is disposed around the spin chuck 8 in a plan view. The scan unit 77 includes an electric motor 78 which generates power to turn the internal nozzle 72. The electric motor 78 may be a coaxial motor coaxial with the vertical portion 72v of the internal nozzle 72 or may be coupled to the vertical portion 72v of the internal nozzle 72 via two pulleys and an endless belt.

When the internal nozzle 72 is disposed at the standby position (the position indicated by the dashed line in FIG. 2), the horizontal portion 72h of the internal nozzle 72 is entirely overlapped with the first guard 23A. When the internal nozzle 72 is disposed at the processing position (the position indicated by the double dotted and dashed line in FIG. 2), the tip portion of the horizontal portion 72h is disposed inside the upper end 23a of the first guard 23A, and the internal nozzle 72 is overlapped with the substrate W. The processing position includes a central processing position (a position indicated by the double dotted and dashed line in FIG. 2) at which the processing liquid discharged from the internal nozzle 72 lands on the central portion of the upper surface of the substrate W and an outer circumference processing position at which the processing liquid discharged from the internal nozzle 72 lands on an outer circumference portion of the upper surface of the substrate W. The ceiling portion 24 of the first guard 23A includes an annular inclined portion 24a which extends obliquely upward from an upper end portion of the tubular portion 25 of the first guard 23A toward the rotation axis A1 and a protrusion portion 24b which protrudes upward from the inclined portion 24a. The inclined portion 24a and the protrusion portion 24b are placed side by side in a circumferential direction (a direction around the rotation axis A1). The protrusion portion 24b includes a pair of side walls 24s which extend upward from the inclined portion 24a, an upper wall 24u which is disposed between upper ends of the pair of side walls 24s and an outer wall 24o which is disposed between outer ends of the pair of side walls 24s. The protrusion portion 24b defines a housing space which is recessed upward from a lower surface of the inclined portion 24a of the first guard 23A.

When the internal nozzle 72 is disposed at the standby position, the horizontal portion 72h of the internal nozzle 72 is entirely overlapped with the protrusion portion 24b in a plan view and housed in the housing space. As shown in FIG. 2, at this time, the tip portion of the horizontal portion 72h at which the discharge port 72p is provided is disposed outside the upper end 23a of the first guard 23A. Where the internal nozzle 72 is disposed at the standby position, the upper end portion of the first guard 23A and the upper end portion of the second guard 23B can be brought closer to each other in the up-down direction. Thereby, it is possible to decrease an amount of the liquid which enters a space between the first guard 23A and the second guard 23B.

As described above, the internal nozzle 72 is supported by the housing 76. Similarly, the scan unit 77 is supported by the housing 76. The electric motor 78 of the scan unit 77 is disposed inside a bellows 75 which can expand and contract in the up-down direction. The housing 76 is supported by the first guard 23A via a first bracket 79A and supported by the guard elevating/lowering unit 27 via a second bracket 79B. When the guard elevating/lowering unit 27 elevates and lowers the first guard 23A, the housing 76 is also elevated and lowered. Thereby, the internal nozzle 72 and the scan unit 77 are elevated and lowered together with the first guard 23A.

Next, an example of processing of the substrate W performed by the substrate processing apparatus 1 will be described.

The following describes an example in which a natural oxidation film of polysilicon exposed at a side surface of a recess portion 83 provided in the substrate W is removed and then a thin film 84 of polysilicon is removed.

Figure 3:
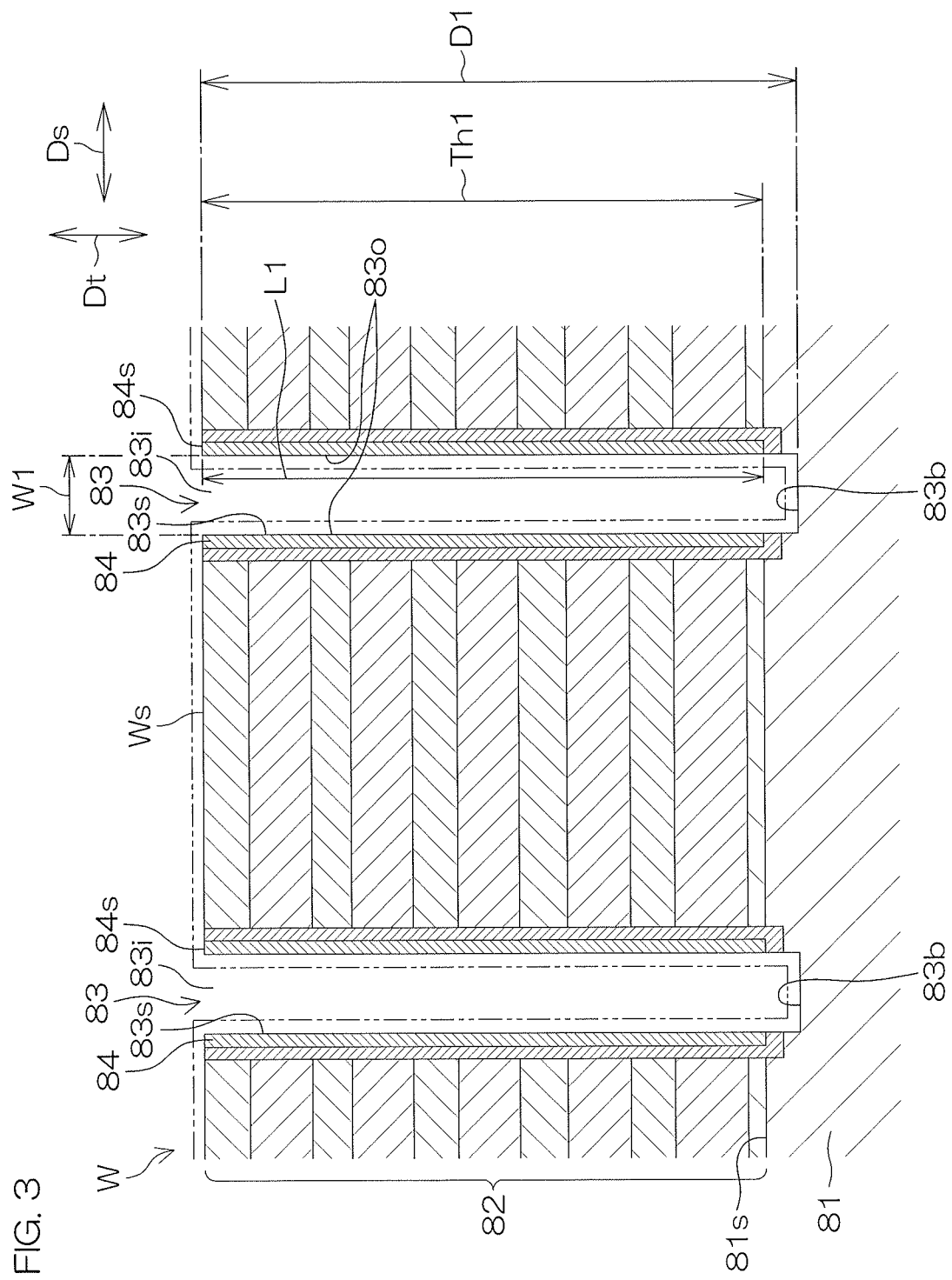
FIG. 3 a schematic view showing an example of a cross-section of a substrate before the substrate is processed.

FIG. 3 is a schematic view showing an example of a cross-section of a substrate W before the substrate W is processed (before the natural oxidation film of polysilicon is removed). In FIG. 3, a surface of a natural oxidation film of the substrate W including the natural oxidation film of polysilicon is indicated by an alternate long and two short dashes line, and a cross-section of the substrate W from which the natural oxidation film is removed is indicated by continuous lines. The following describes the substrate W from which the natural oxidation film is removed.

As shown in FIG. 3, the substrate W includes a plate-shaped base material 81 made of glass or semiconductor such as silicon and one or more thin films 82 formed on the base material 81. FIG. 3 shows an example in which a plurality of thin films 82 are laminated on the base material 81. The substrate W includes one or more recess portions 83 which extend in a thickness direction Dt of the substrate W. The recess portion 83 may be any of a trench, a via hole and a contact hole, or may be other than these.

The recess portion 83 extends in the thickness direction Dt of the substrate W from the outermost surface Ws of the substrate W (a surface of the farthest thin films 82 located on the surface side). The recess portion 83 includes an entrance 83i which is open at the outermost surface Ws of the substrate W, a bottom surface 83b which is provided at the interior of the substrate W and a side surface 83s which extends from the outermost surface Ws of the substrate W to the bottom surface 83b. The side surface 83s of the recess portion 83 includes a pair of opposing portions 83o which face each other in a width direction of the recess portion 83. The depth direction of the recess portion 83 coincides with the thickness direction Dt of the substrate W, and the width direction of the recess portion 83 coincides with a surface direction Ds of the substrate W perpendicular to the thickness direction Dt of the substrate W.

A depth D1 of the recess portion 83, that is, a distance in the thickness direction Dt of the substrate W from the outermost surface Ws of the substrate W to the bottom surface 83b of the recess portion 83 is longer than a width W1 of the recess portion 83, that is, a gap of the pair of opposing portions 83o in the surface direction Ds. The width W1 of the recess portion 83 may change continuously or step by step as it approaches the bottom surface 83b of the recess portion 83, or may be constant from the entrance 83i to the bottom surface 83b. FIG. 3 shows an example in which the recess portion 83 penetrates all of the thin films in the thickness direction Dt of the substrate W and is recessed from a surface 81s of the base material 81 in the thickness direction Dt. The recess portion 83 may be provided only in one or more thin films 82. In a case where the thin film 82 is not formed on the base material 81, the recess portion 83 may be provided only in the base material 81.

The thin film 84 of polysilicon forms the side surface 83s of the recess portion 83. That is, the pair of opposing portions 83o of the side surface 83s of the recess portion 83 is defined by the thin film 84 of polysilicon. The thin film 84 of polysilicon extends in the thickness direction Dt of the substrate W from the entrance 83i of the recess portion 83 toward the bottom surface 83b of the recess portion 83. A tip end surface 84s of the thin film 84 of polysilicon may be located on the same plane as the outermost surface Ws of the substrate W.

The length L1 of the thin film 84 of polysilicon in the thickness direction Dt is longer than the width W1 of the recess portion 83, and shorter than the depth D1 of the recess portion 83. The length L1 of the thin film 84 of polysilicon is longer than a thickness Th1 of the whole of the thin films 82 for led on the base material 81, that is, a distance in the thickness direction Dt from the outermost surface Ws of the substrate W to the surface 81s of the base material 81. The length L1 of the thin film 84 of polysilicon may be equal to the depth D1 of the recess portion 83, or may be smaller than the thickness Th1 of the whole of the thin films 82.

Figure 4:
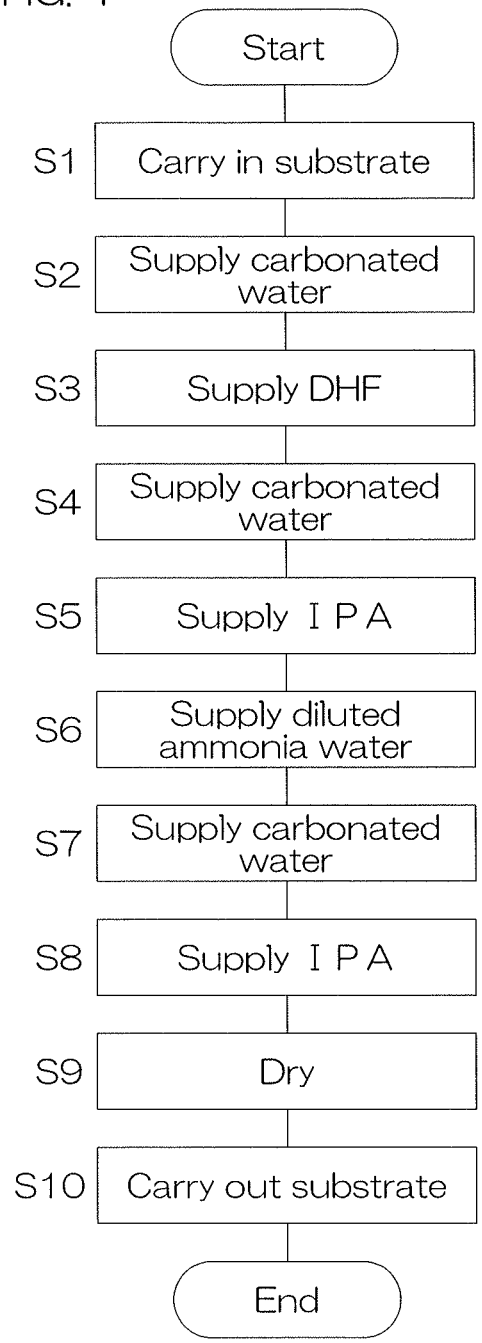
FIG. 4 a process chart for explaining an example of processing of the substrate performed by the substrate processing apparatus.

FIG. 4 is a process chart for explaining an example of processing of the substrate W performed by the substrate processing apparatus 1. FIGS. 5A-5F and FIGS. 6A-6E are schematic cross-sectional views showing states of the substrate processing apparatus 1 when the example of the processing of the substrate W shown in FIG. 4 is being performed. FIG. 7 is a time chart showing operations of the substrate processing apparatus 1 when the example of the processing of the substrate W shown in FIG. 4 is being performed. In FIG. 7, ON for IPA represents that IPA is being discharged toward the substrate W, OFF for IPA represents that the discharge of IPA is being stopped. The same applies to the processing liquid such as the diluted ammonia water (it is represented as NH4OH in FIG. 7).

FIG. 1 and FIG. 2 will be referred to below. FIG. 4 to FIG. 7 will be referred to as appropriate. The controller 3 performs the following operations by controlling the substrate processing apparatus 1. In other words, the controller 3 is programmed so as to perform the following operations. The controller 3 is a computer including a memory 3m that stores data such as a program, and a processor 3a that controls the substrate processing apparatus 1 according to the data stored in the memory 3m.

When the substrate W is processed by the substrate processing apparatus 1, a carry-in step is performed to carry the substrate W into the chamber 4 (Step S1 in FIG. 4).

Specifically, all the scan nozzles including the first chemical liquid nozzle 31 are disposed at the standby position and all the guards 23 are disposed at the lower position. Further, the shielding member 13 is disposed at the upper position. In this state, the transfer robot causes a hand to advance into the chamber 4 while supporting the substrate W with the hand. Thereafter, the transfer robot places the substrate W on the hand on the spin chuck 8 in a state where the front surface of the substrate W is faced upward. The transfer robot causes the hand to retract from the interior of the chamber 4 after the substrate W has been placed on the spin chuck 8.

Next, a first carbonated water supplying step is performed to supply the carbonated water to the substrate W (Step S2 in FIG. 4).

Specifically, the upper gas valve 71 and the lower gas valve 60 are opened, and the upper central opening 68 of the shielding member 13 and the lower central opening 57 of the spin base 10 start to discharge nitrogen gas. The guard elevating/lowering unit 27 elevates the first guard 23A and the second guard 23B while locating the third guard 23C at the lower position, thereby locating the upper end 23a of the first guard 23A and that of the second guard 23B above the substrate W. The first nozzle movement unit 38 moves the first nozzle arm 37, thereby locating the discharge port of the first chemical liquid nozzle 31 and the discharge port of the first rinse liquid nozzle 34 above the substrate W. The spin motor 12 starts to rotate the substrate W in a state where the substrate W is gripped by the chuck pins 9.

Figure 5A:
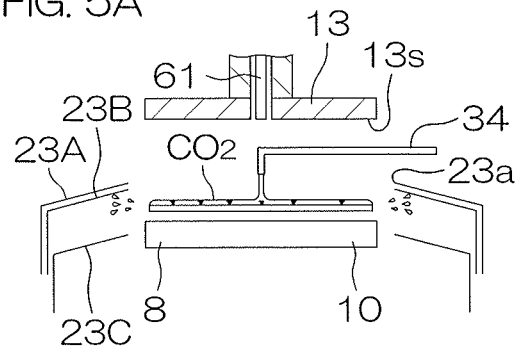
FIGS. 5A-5C a schematic cross-sectional view showing a state of the substrate processing apparatus when the example of the processing of the substrate shown in FIG. 4 is being performed.

In this state, the first rinse liquid valve 36 is opened and the first rinse liquid nozzle 34 starts discharging the carbonated water. As shown in FIG. 5A, the carbonated water discharged from the first rinse liquid nozzle 34 lands on the upper surface central portion of the substrate W and then flows outward along the upper surface of the rotating substrate W. Thus, a liquid film of the carbonated water covering the entire upper surface of the substrate W is formed on the substrate W. In a case where the substrate W is charged, electric charges move to the carbonated water from the substrate W and the electric charges are removed from the substrate W. When a predetermined time has elapsed after the first rinse liquid valve 36 is opened, the first rinse liquid valve 36 is closed and the discharge of the carbonated water from the first rinse liquid nozzle 34 is stopped.

Next, a DHF supplying step is performed to supply DHF to the substrate W (step S3 in FIG. 4).

Figure 5B:
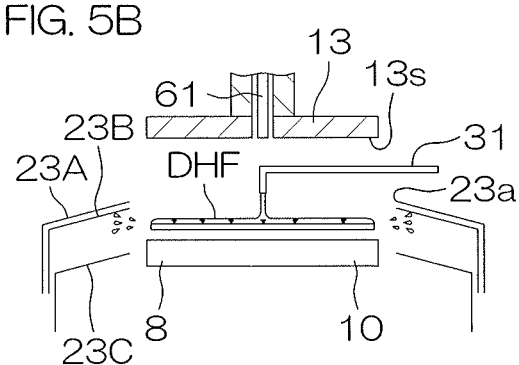

Specifically, in a state where the discharge port of the first chemical liquid nozzle 31 and the discharge port of the first rinse liquid nozzle 34 are disposed above the substrate W, the first chemical liquid valve 33 is opened, the first chemical liquid nozzle 31 starts discharging DHF. As shown in FIG. 5B, DHF discharged from the first chemical liquid nozzle 31 lands on the upper surface central portion of the substrate W and then flows outward along the upper surface of the rotating substrate W. Thus, the carbonated water on the substrate W is replaced by DHF, and a liquid film of DHF covering the entire upper surface of the substrate W is formed. When a predetermined time has elapsed after the first chemical liquid valve 33 is opened, the first chemical liquid valve 33 is closed and the discharge of DHF from the first chemical liquid nozzle 31 is stopped.

Next, a second carbonated water supplying step is performed to supply the carbonated water to the substrate W (step S4 in FIG. 4).

Figure 5C:
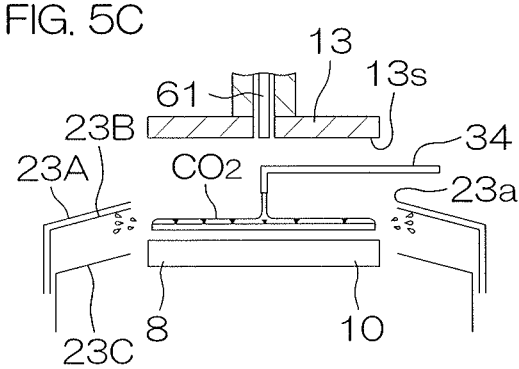

Specifically, in a state where the discharge port of the first chemical liquid nozzle 31 and the discharge port of the first rinse liquid nozzle 34 are disposed above the substrate W, the first rinse liquid valve 36 is opened, the first rinse liquid nozzle 34 starts discharging the carbonated water. As shown in FIG. 5C, the carbonated water discharged from the first rinse liquid nozzle 34 lands on the upper surface central portion of the substrate W and then flows outward along the upper surface of the rotating substrate W. Thus, DHF on the substrate W is replaced by the carbonated water, and a liquid film of the carbonated water covering the entire upper surface of the substrate W is foiled.

Figure 5D:
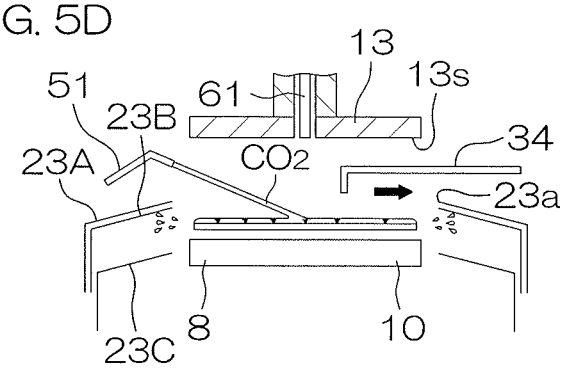
FIGS. 5D-5F a schematic cross-sectional view showing a state of the substrate processing apparatus when the example of the processing of the substrate shown in FIG. 4 is being performed.

When a predetermined time has elapsed after the first rinse liquid valve 36 is opened, the third rinse liquid valve 53 is opened while keeping the first rinse liquid valve 36 opened. Thus, the fixed nozzle 51 starts discharging the carbonated water. As shown in FIG. 5D, the carbonated water discharged from the fixed nozzle 51 lands on the upper surface central portion of the substrate W and then flows outward along the upper surface of the rotating substrate W. The first rinse liquid valve 36 is closed after the third rinse liquid valve 53 is opened. Thus, the discharge of the carbonated water from the first rinse liquid nozzle 34 is stopped. After that, the first nozzle movement unit 38 retreats the first chemical liquid nozzle 31 and the first rinse liquid nozzle 34 from above of the substrate W.

Next, a first IPA supplying step is performed to supply IPA to the substrate W (step S5 in FIG. 4).

Specifically, after the first chemical liquid nozzle 31 and the first rinse liquid nozzle 34 are retreated from above of the substrate W, the guard elevating/lowering unit 27 elevates the third guard 23C and locates the upper ends 23a of the first guard 23A, the second guard 23B, and the third guard 23C above the substrate W. After that, the third rinse liquid valve 53 is closed, and the discharge of the carbonated water from the fixed nozzle 51 is stopped.

Figure 5E:
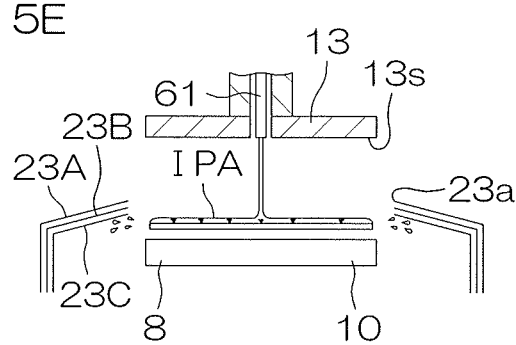

IPA discharged from the central nozzle 61 passes through the upper central opening 68 of the shielding member 13 located at the upper position and lands on the upper surface central portion of the substrate W. As shown in FIG. 5E, IPA that has landed on the upper surface of the substrate W flows outward along the upper surface of the rotating substrate W. Thus, the carbonated water on the substrate W is replaced by IPA, and a liquid film of IPA covering the entire upper surface of the substrate W is formed. After that, the solvent valve 66 is closed, and the discharge of IPA from the central nozzle 61 is stopped.

Next, an ammonia water supplying step is performed to supply the diluted ammonia water to the substrate W (step S6 in FIG. 4).

Specifically, the second nozzle movement unit 48 moves the second nozzle arm 47 when the central nozzle 61 is discharging IPA, and moves the discharge port of the second chemical liquid nozzle 41 and the discharge port of the second rinse liquid nozzle 44 to between the substrate W and the shielding member 13. At this time, although the second chemical liquid nozzle 41 and the second rinse liquid nozzle 44 are disposed near a liquid column of IPA extending downward from the central nozzle 61, they are separate horizontally from the liquid column of IPA.

After the second chemical liquid nozzle 41 and the second rinse liquid nozzle 44 are disposed between the substrate W and the shielding member 13, the solvent valve 66 is closed, and the discharge of IPA from the central nozzle 61 is stopped. After that, the second nozzle movement unit 48 moves the second nozzle arm 47, and causes the discharge port of the second chemical liquid nozzle 41 and the discharge port of the second rinse liquid nozzle 44 to face the upper surface central portion of the substrate W. Subsequently, the second chemical liquid valve 43 is opened, and the second chemical liquid nozzle 41 starts discharging the diluted ammonia water.

Figure 5F:
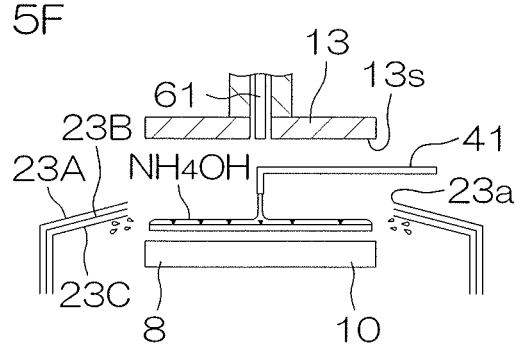

As shown in FIG. 5F, the diluted ammonia water discharged from the second chemical liquid nozzle 41 lands on the upper surface central portion of the substrate W and then flows outward along the upper surface of the rotating substrate W. Thus, IPA on the substrate W is replaced by the diluted ammonia water, and a liquid film of the diluted ammonia water covering the entire upper surface of the substrate W is formed. When a predetermined time has elapsed after the second chemical liquid valve 43 is opened, the second chemical liquid valve 43 is closed, and the discharge of the diluted ammonia water from the second chemical liquid nozzle 41 is stopped.

As shown in FIG. 7, when a predetermined time has elapsed after the solvent valve 66 is opened in the first IPA supplying step, the spin motor 12 lowers the rotation speed of the substrate W from a first high rotation speed Vh1 to a low rotation speed VL1, and keep it at the low rotation speed VL1. After that, the spin motor 12 raises the rotation speed of the substrate W from the low rotation speed VL1 to a second high rotation speed Vh2, and keep it at the second high rotation speed Vh2.

The first high rotation speed Vh1 and the second high rotation speed Vh2 are 500 to 1000 rpm, for example. The first high rotation speed Vh1 may be equal to the second high rotation speed Vh2, or may be different from the second high rotation speed Vh2. The low rotation speed VL1 is 1 to 40 rpm, for example. The low rotation speed VL1 is an example of a first rotation speed, and the second high rotation speed Vh2 is an example of a second rotation speed.

The time when the discharge of IPA is stopped in the first IPA supplying step, that is, the time when the solvent valve 66 is closed is after the rotation speed of the substrate W is lowered to the low rotation speed VL1. The solvent valve 66 may be closed when the rotation speed of the substrate W is being kept at the low rotation speed VL1, or may be closed after the rise of the rotation speed of the substrate W starts. FIG. 7 shows an example of the latter.

As shown in FIG. 7, the second chemical liquid valve 43 is opened when the rotation speed of the substrate W is rising from the low rotation speed VL1 to the second high rotation speed Vh2. That is, the discharge of the diluted ammonia water is started at a time T1 between a time Ts when the rise of the rotation speed of the substrate W is started and a time Te when the rise of the rotation speed of the substrate W is stopped. After the rotation speed of the substrate W has reached the second high rotation speed Vh2, the second chemical liquid valve 43 is closed.

After the ammonia water supplying step is performed, a third carbonated water supplying step is performed to supply the carbonated water to the substrate W (step S7 in FIG. 4).

Figure 6A:
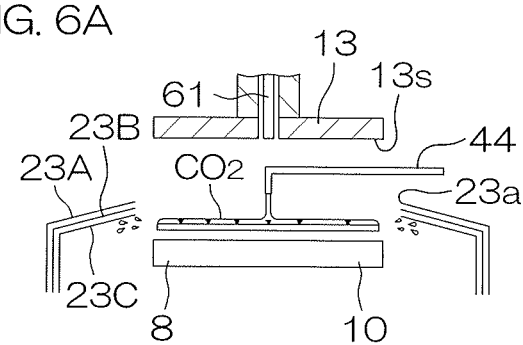
FIGS. 6A-6C a schematic cross-sectional view showing a state of the substrate processing apparatus when the example of the processing of the substrate shown in FIG. 4 is being performed.

Specifically, in a state where the discharge port of the second chemical liquid nozzle 41 and the discharge port of the second rinse liquid nozzle 44 are disposed above the substrate W, the second rinse liquid valve 46 is opened, and the second rinse liquid nozzle 44 starts discharging the carbonated water. As shown in FIG. 6A, the carbonated water discharged from the second rinse liquid nozzle 44 lands on the upper surface central portion of the substrate W and then flows outward along the upper surface of the rotating substrate W. Thus, the diluted ammonia water on the substrate W is replaced by the carbonated water, a liquid film of the carbonated water covering the entire upper surface of the substrate W is formed.

Figure 6B:
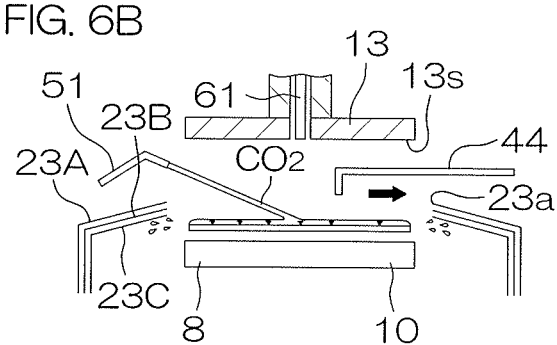

When a predetermined time has elapsed after the second rinse liquid valve 46 is opened, the third rinse liquid valve 53 is opened while keeping the second rinse liquid valve 46 opened. Thus, the discharge of the carbonated water from the fixed nozzle 51 is started. As shown in FIG. 6B, the carbonated water discharged from the fixed nozzle 51 lands on the upper surface central portion of the substrate W and then flows outward along the upper surface of the rotating substrate W. Thus, the diluted ammonia water on the substrate W is replaced by the carbonated water, and a liquid film of the carbonated water covering the entire upper surface of the substrate W is formed. The second rinse liquid valve 46 is closed after the third rinse liquid valve 53 is opened. Thus, the discharge of the carbonated water from the second rinse liquid nozzle 44 is stopped. After that, the second nozzle movement unit 48 retreats the second chemical liquid nozzle 41 and the second rinse liquid nozzle 44 from above the substrate W.

Figure 6C:
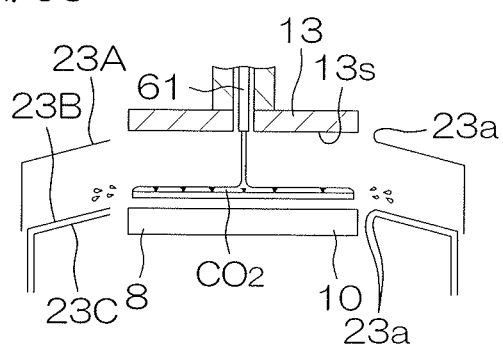

The shielding member elevating/lowering unit 15 lowers the shielding member 13 from the upper position to an upper intermediate position after the second chemical liquid nozzle 41 and the second rinse liquid nozzle 44 have retreated from above the substrate W. After that, the upper rinse liquid valve 64 is opened, and the central nozzle 61 starts discharging the carbonated water. After that, the third rinse liquid valve 53 is closed, and the discharge of the carbonated water from the fixed nozzle 51 is stopped. As shown in FIG. 6C, the carbonated water discharged from the central nozzle 61 lands on the upper surface central portion of the substrate W and then flows outward along the upper surface of the rotating substrate W. Thus, the diluted ammonia water on the substrate W is replaced by the carbonated water, a liquid film of the carbonated water covering the entire upper surface of the substrate W is formed. When a predetermined time has elapsed after the upper rinse liquid valve 64 is opened, the upper rinse liquid valve 64 is closed, and the discharge of the carbonated water from the central nozzle 61 is stopped.

The guard elevating/lowering unit 27 raises the first guard 23A and lowers the second guard 23B and the third guard 23C during a period of time from the time when the discharge of the carbonated water from the fixed nozzle 51 is stopped to the time when the discharge of the carbonated water from the central nozzle 61 is stopped. Thus, the upper ends 23a of the second guard 23B and the third guard 23C are disposed below the upper surface of the spin base 10. The upper end 23a of the first guard 23A may be disposed at a height equal to the lower surface 13s of the shielding member 13, or may be disposed at a height higher or lower than the lower surface 13s of the shielding member 13.

Next, a second IPA supplying step (a time T2 to a time T3 in FIG. 7) is performed to supply IPA to the substrate W (step S8 in FIG. 4).

Figure 6D:
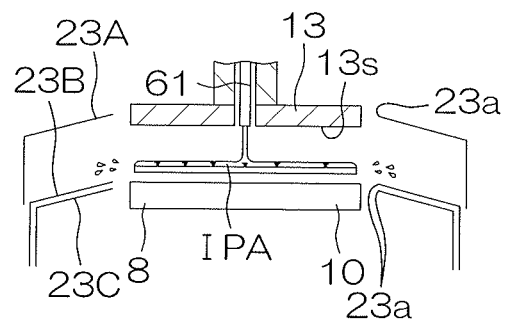
FIGS. 6D-6E a schematic cross-sectional view showing a state of the substrate processing apparatus when the example of the processing of the substrate shown in FIG. 4 is being performed.

Specifically, the shielding member elevating/lowering unit 15 lowers the shielding member 13 from the upper intermediate position to a lower intermediate position. Thus, the lower surface 13s of the shielding member 13 is disposed at a height equal to the upper end 23a of the first guard 23A or a height lower than the upper end 23a of the first guard 23A. After that, the solvent valve 66 is opened, and the central nozzle 61 starts discharging IPA. As shown in FIG. 6D, IPA discharged from the central nozzle 61 lands on the upper surface central portion of the substrate W and then flows outward along the upper surface of the rotating substrate W. When a predetermined time has elapsed after the solvent valve 66 is opened, the solvent valve 66 is closed, and the discharge of IPA from the central nozzle 61 is stopped.

Next, a drying step is performed to dry the substrate W by the high speed rotation of the substrate W (Step S9 in FIG. 4).

Figure 6E:
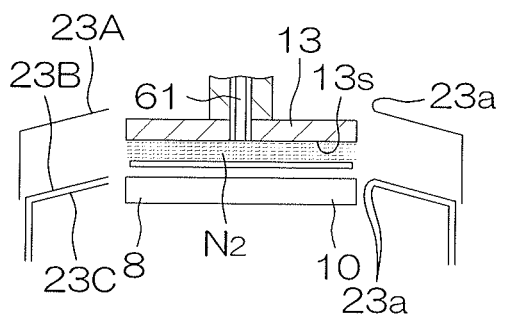

Specifically, after the discharge of IPA from the central nozzle 61 is stopped, the spin motor 12 raises the rotation speed of the substrate W. Thus, a liquid film of IPA covering the entire upper surface of the substrate W gradually gets thin. The shielding member elevating/lowering unit 15 lowers the shielding member 13 from the lower intermediate position to the lower position after the acceleration of the substrate W is started. Thus, a gap between the substrate W and the shielding member 13 continuously decreases. A liquid adhering to the substrate W is scattered around the substrate W due to the high speed rotation of the substrate W. Thus, as shown in FIG. 6E, the substrate W is dried in a state where a space between the substrate W and the shielding member 13 is filled with nitrogen gas. When a predetermined time has elapsed after the high speed rotation of the substrate W is started, the spin motor 12 stops rotating. Thus, the rotation of the substrate W is stopped.

Next, a carry-out step is performed to carry the substrate W out of the chamber 4 (Step S10 in FIG. 4).

Specifically, the upper gas valve 71 and the lower gas valve 60 are closed to stop discharge of nitrogen gas from the upper central opening 68 of the shielding member 13 and the lower central opening 57 of the spin base 10. The guard elevating/lowering unit 27 lowers all the guards 23 to the lower position. The shielding member elevating/lowering unit 15 elevates the shielding member 13 to the upper position. The transfer robot supports the substrate W on the spin chuck 8 by the hand after the plurality of chuck pins 9 have released the gripped substrate W. Thereafter, the transfer robot causes the hand to retract from the interior of the chamber 4, with the substrate W being supported by the hand. Thereby, the substrate W which has been processed is carried out of the chamber 4.

As described above, in the present embodiment, DHF is supplied to the substrate W (DHF supplying step). Thus, the natural oxidation films are removed from the outermost surface Ws of the substrate W, the side surface 83s of the recess portion 83, and the bottom surface 83b of the recess portion 83. At this time, the natural oxidation film of polysilicon is removed, and an unoxidized thin film 84 of polysilicon is exposed at the side surface 83s of the recess portion 83. A surface of the thin film 84 of polysilicon is a hydrophobic surface that is not covered with the natural oxidation film of polysilicon.

Since the surface of the thin film 84 of polysilicon from which the natural oxidation film is removed is a hydrophobic surface, when water-containing liquid a main component of which is water is supplied to the substrate W after DHF is supplied to the substrate W, the water-containing liquid may not be uniformly supplied to the thin film 84 of polysilicon. Since the diluted ammonia water is a type of the water-containing liquid, when the diluted ammonia water is supplied without supplying IPA, the diluted ammonia water may not be uniformly supplied to the thin film 84 of polysilicon. In this case, as shown in the upper portion of FIG. 8, a portion of the polysilicon tends to not be etched and to remain on the dried substrate W.

Furthermore, ammonium hydroxide contained in the diluted ammonia water reacts with silicon according to the reaction formula of "2NH4OH+Si→Si(OH)2+H2+2NH3" and etches the silicon. As can be understood from this reaction formula, when the silicon is etched, hydrogen gas and ammonia gas are generated and bubbles are formed in the diluted ammonia water. As shown in the upper portion of FIG. 8, when the diluted ammonia water is supplied without supplying IPA, many large bubbles are generated in the recess portion 83, the recess portion 83 may be clogged with the bubbles. In this case, new diluted ammonia water cannot flow in the recess portion 83, and thus the residual amount of the polysilicon increases.

In contrast, in a case where IPA is supplied after DHF is supplied and before the diluted ammonia water is supplied, since IPA includes an isopropyl group, IPA spreads over the thin film 84 of polysilicon even when the thin film 84 of polysilicon is hydrophobic. The diluted ammonia water is supplied to the substrate W in a state where the thin film 84 of polysilicon is coated by IPA including a hydroxy group, and thus the diluted ammonia water spreads over the thin film 84 of polysilicon. Thus, it is possible to uniformly supply the diluted ammonia water to the thin film 84 of polysilicon.

Furthermore, since the reaction between the ammonium hydroxide and the silicon is inhibited by IPA adhering to the thin film 84 of polysilicon, an amount of gas generated per unit time is decreased. Thus, as shown in the lower portion of FIG. 8, the number of bubbles generated per unit time is small. Or only small bubbles can be generated. When the bubbles are small, the bubbles easily come out of the recess portion 83 via the entrance 83i of the recess portion 83. Thus, the recess portion 83 is hard to be clogged with the bubbles. Similarly, when the number of generated bubbles is small, the recess portion 83 is hard to be clogged with the bubbles. Furthermore, the flow of the diluted ammonia water that enters and comes out of the recess portion 83 is hard to be disturbed by the bubbles and thus it is possible to effectively replace the diluted ammonia water in the recess portion 83 with the new diluted ammonia water.

As described above, since the diluted ammonia water is supplied to the substrate W in a state where IPA is adhered to the thin film 84 of polysilicon, it is possible to spread the diluted ammonia water over the thin film 84 of polysilicon even after the natural oxidation film is removed. Furthermore, since the amount of gas generated per unit time can be reduced, it is possible to maintain a state where the diluted ammonia water is uniformly supplied to the thin film 84 of polysilicon and to continue supplying the highly active ammonia water to the thin film 84 of polysilicon. Thus, it is possible to effectively etch the polysilicon in the recess portion 83 and to reduce the polysilicon remaining in the recess portion 83.

In the present embodiment, the diluted ammonia water is discharged toward a liquid landing position within the front surface of the substrate W in a state where the entire front surface of the substrate W is covered with the liquid film of IPA. IPA on the liquid landing position is washed away around the liquid landing position by the diluted ammonia water that has landed on the front surface of the substrate W. Thus, an almost circular liquid film of the diluted ammonia water is formed on the front surface of the substrate W. On the other hand, the liquid film of IPA changes into an annular shape surrounding the liquid film of the diluted ammonia water. When the discharge of the ammonia water continues, the outer circumferential portion of the liquid film of the diluted ammonia water spreads outward and the entire front surface of the substrate W is covered with the liquid film of the diluted ammonia water.

As shown in FIG. 9, when the substrate W starts to rotate at high speed before starting discharging the diluted ammonia water, IPA may flow from the front surface central portion of the substrate W to around it before supplying the diluted ammonia water to the substrate W, and it may cause the front surface central portion of the substrate W to be exposed from the liquid film of IPA. Meanwhile, as shown in FIG. 10, when both of IPA and the diluted ammonia water exist on the substrate W and the rotation speed of the substrate W is too low, the front surface outer circumferential portion of the substrate W may be partially exposed. This is because Marangoni convection, in which IPA on the substrate W flows inward toward the diluted ammonia water on the substrate W, occurs.

In the ammonia water supplying step, the discharge of the diluted ammonia water is started while raising the rotation speed of the substrate W from the low rotation speed VL1 to the high rotation speed Vh2, and the discharge of the diluted ammonia water is continued while keeping the rotation speed of the substrate W at the high rotation speed Vh2. Since the rotation speed of the substrate W is low when starting discharging the diluted ammonia water, the front surface central portion of the substrate W is not exposed from the liquid film of IPA before supplying the diluted ammonia water. Furthermore, since the centrifugal force applied to IPA and the diluted ammonia water on the substrate W gradually increases, the front surface central portion of the substrate W is also not exposed from the liquid film of IPA due to Marangoni convection. Thus, it is possible to replace IPA on the substrate W with the diluted ammonia water while maintaining a state where the entire front surface of the substrate W is covered with the liquid film.

As long as the front surface outer circumferential portion of the substrate W is not partially exposed, the time when the discharge of the diluted ammonia water is started may be before the time when the acceleration of the substrate W is started. However, in this case, the amount of IPA on the substrate W is almost unchanged between the time when the discharge of the diluted ammonia water is started and the time before the discharge of the diluted ammonia water is started. In contrast, in a case where the discharge of the diluted ammonia water is started while raising the rotation speed of the substrate W from the low rotation speed VL1 to the high rotation speed Vh2, IPA is removed due to the centrifugal force and the amount of IPA on the substrate W decreases after the acceleration of the substrate W is started and before the diluted ammonia water is supplied to the substrate W.

The diluted ammonia water is mixed with IPA on the substrate W. The concentration of ammonia contained in the liquid on the substrate W lowers as the amount of IPA on the substrate W increases. It is possible to decrease the decrease amount of the concentration of ammonia as compared with a case where the discharge of the diluted ammonia water is started before the acceleration of the substrate W is started and to shorten the time required to etch the polysilicon by staring discharging the diluted ammonia water while raising the rotation speed of the substrate W from the low rotation speed VL1 to the high rotation speed Vh2. Thus, it is preferable to start discharging the diluted ammonia water while accelerating the substrate W in the rotation direction.

In the present embodiment, a portion of the thin film 84 of polysilicon is disposed at the entrance 83$i$ of the recess portion 83. When ammonium hydroxide contained in the diluted ammonia water reacts with the polysilicon, gas is produced. Thus, gas is produced at the entrance 83$i$ of the recess portion 83. Furthermore, the bubbles generated in the recess portion 83 flow toward the entrance 83$i$ of the recess portion 83. However, since the thin film 84 of polysilicon is coated with IPA before the diluted ammonia water is supplied to the substrate W, it is possible to reduce an amount of gas generated per unit time and to suppress or prevent the entrance 83$i$ of the recess portion 83 from being clogged with the bubbles.

In the present embodiment, the thin film 84 of polysilicon is disposed at a wide range of the side surface of the recess portion 83. Thus, the amount of gas, which is generated when etching the polysilicon, increases. Furthermore, since the polysilicon is long in the depth direction of the recess portion 83, the bottom surface of the thin film 84 of polysilicon approaches the bottom surface 83$b$ of the recess portion 83 at which the diluted ammonia water is hard to arrive as compared to the entrance 83$i$ of the recess portion 83. However, since the thin film 84 of polysilicon is coated with IPA before the diluted ammonia water is supplied to the substrate W, it is possible to reduce an amount of gas generated per unit time and to suppress or prevent the entrance 83$i$ of the recess portion 83 from being clogged with the bubbles.

Other Preferred Embodiments

The present invention is not restricted to the contents of the embodiments described above and various modifications are possible.

For example, IPA may be discharged from a nozzle other than the central nozzle 61. IPA may be discharged from a scan nozzle similar to the first chemical liquid nozzle 31.

If IPA of room temperature is supplied to the substrate W, the solvent heater 67 may be omitted.

If the internal nozzle 72 is not required, the internal nozzle 72 and the components related to this (the scan unit 77, the protrusion portion 24$b$ of the first guard 23A and so on) may be omitted.

In the above-described example of the processing of the substrate W, when the first rinse liquid nozzle 34 is discharging the carbonated water, the first nozzle movement unit 38 may move the first rinse liquid nozzle 34 between a central processing position where the carbonated water discharged from the first rinse liquid nozzle 34 lands on the upper surface central portion of the substrate W and an outer circumferential processing position where the carbonated water discharged from the first rinse liquid nozzle 34 lands on the upper surface outer circumferential portion of the substrate W. The same applies to other scan nozzles such as the first chemical liquid nozzle 31.

As shown in FIG. 11, the first IPA supplying step (a time T4 to a time T5 in FIG. 11) and the ammonia water supplying step (a time T6 to a time T7 in FIG. 11) may be performed again after the ammonia water supplying step (step S6 in FIG. 4) is performed and before the third carbonated water supplying step (step S7 in FIG. 4) is performed. In other words, a cycle including the first IPA supplying step and the ammonia water supplying step may be performed a plurality of times after the second carbonated water supplying step (step S4 in FIG. 4) is performed and before the third carbonated water supplying step (step S7 in FIG. 4) is performed.

In this case, IPA and the diluted ammonia water are supplied to the substrate W in this order, and then IPA and the diluted ammonia water are supplied again to the substrate W in this order. IPA adhering to the thin film 84 of polysilicon gradually decreases due to the supply of the diluted ammonia water. It is possible to replenish IPA to the thin film 84 of polysilicon by supplying again IPA to the substrate W. Thus, it is possible to spread the diluted ammonia water over the thin film 84 of polysilicon.

One or both of the first IPA supplying step and the ammonia water supplying step may be performed in a state where a sealing property of a space between the substrate W and the shielding member 13 is high. Specifically, as shown in FIG. 12 and FIG. 13, at least one of the first IPA supplying step and the ammonia water supplying step may be performed in a state where at least one of the upper ends 23a of the guards 23 is located at a height equal to the lower surface 13s of the shielding member 13 or a height higher than the lower surface 13s of the shielding member 13.

Figure 12:
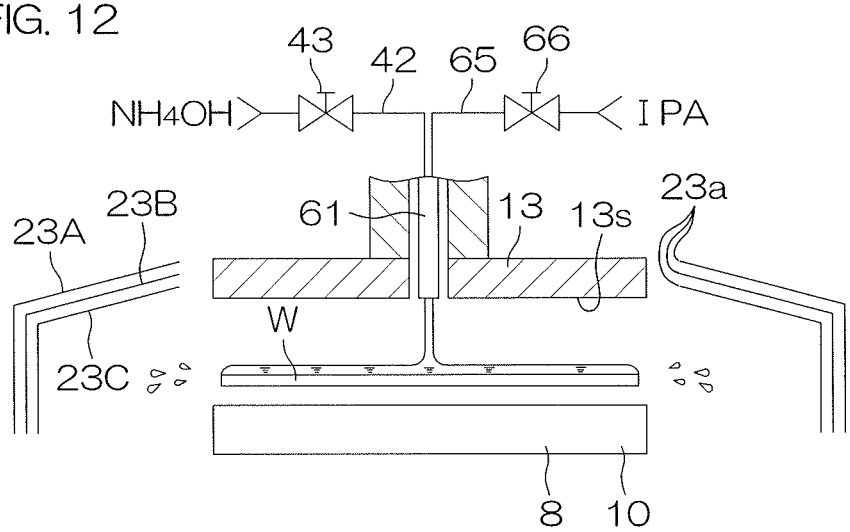
FIG. 12 a schematic cross-sectional view showing a state of the substrate processing apparatus when a first IPA supplying step and a diluted ammonia water supplying step are being performed while improving the sealing property of a space between the substrate and a shielding member.
Figure 13:
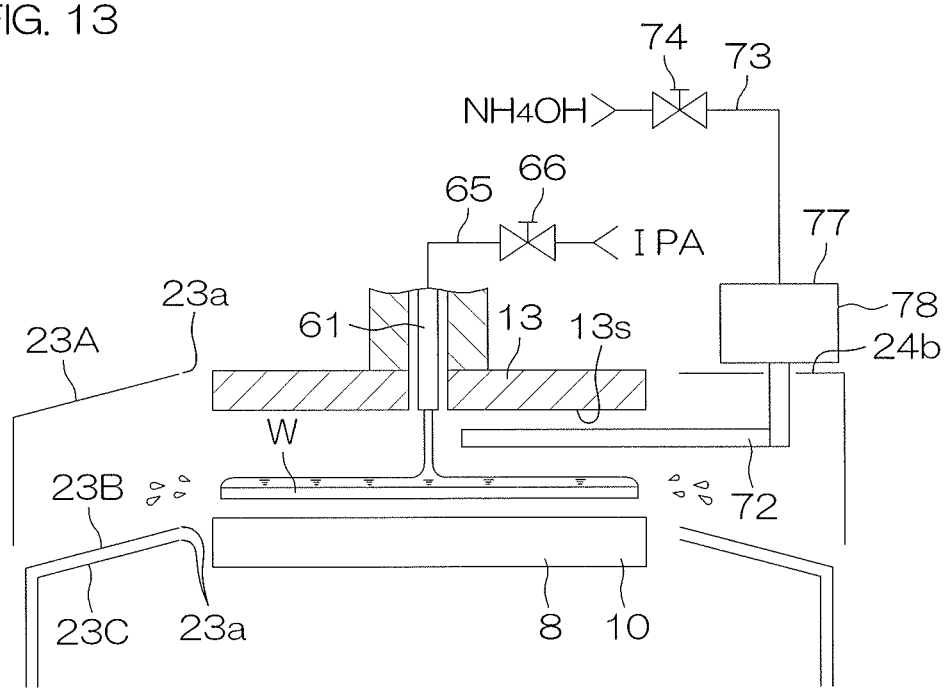
FIG. 13 a schematic cross-sectional view showing a state of the substrate processing apparatus when the first IPA supplying step and the diluted ammonia water supplying step are being performed while improving the sealing property of the space between the substrate and the shielding member.

In this case, the diluted ammonia water may be discharged from the central nozzle 61 as shown in FIG. 12, or may be discharged from the internal nozzle 72 located between the substrate W and the shielding member 13 as shown in FIG. 13. Instead of causing the central nozzle 61 to discharge IPA, the central nozzle 61 may discharge the diluted ammonia water and the internal nozzle 72 located between the substrate W and the shielding member 13 may discharge IPA.

As shown in FIG. 12 and FIG. 13, in a case where the first IPA supplying step and the ammonia water supplying step are performed when the sealing property of the space between the substrate W and the shielding member 13 is high, the upper surface of the substrate W is protected by the lower surface 13s of the shielding member 13 which is an example of a facing surface. The outer circumferential surface of the substrate W is protected by the guard 23. Furthermore, the space between the substrate W and the lower surface 13s of the shielding member 13 is surrounded by the guard 23 and thus the sealing property of this space can be improved. Thus, it is possible to process the substrate W while protecting the substrate W from an atmosphere including particles.

The controller 3 may raise the rotation speed of the substrate W by controlling the spin motor 12 (refer to FIG. 1) in a state where the entire front surface of the substrate W is covered with the liquid film of the diluted ammonia water. In addition to this or instead of this, the controller 3 may increase the flow rate of the diluted ammonia water discharged toward the front surface of the substrate W by increasing the opening degree of the second flow rate control valve 49 (refer to FIG. 1) in a state where the entire front surface of the substrate W is covered with the liquid film of the diluted ammonia water.

When the rotation speed of the substrate W rises, the centrifugal force applied to the liquid on the substrate W increases and the flow speed of the liquid at the substrate W rises. Similarly, when the flow rate of the liquid discharged toward the front surface of the substrate W increases, the flow speed of the liquid at the substrate W rises. Thus, it is possible to raise the flow speed of the diluted ammonia water at the substrate W and to drive the removal of the bubbles from the recess portion 83 by performing at least one of the acceleration of the substrate W in the rotation direction and the increase in the discharge flow rate of the diluted ammonia water. Thus, it is possible to continue supplying uniformly the diluted ammonia water to the thin film 84 of polysilicon in the ammonia water supplying step.

Also, as shown in FIG. 14, the controller 3 may alternately perform the acceleration of the substrate W and the deceleration of the substrate W by controlling the spin motor 12 in a state where at least a portion of the front surface of the substrate W is covered with the liquid film of the diluted ammonia water.

In addition to this or instead of this, as shown in FIG. 14, the controller 3 may alternately perform the increase in the discharge flow rate of the diluted ammonia water and the decrease in the discharge flow rate of the diluted ammonia water by changing the opening degree of the second flow rate control valve 49.

FIG. 14 is drawn so that the rotation speed of the substrate W and the discharge flow rate of the diluted ammonia water are changed at the same time, but the rotation speed of the substrate W and the discharge flow rate of the diluted ammonia water may be changed at different times.

When the rotation speed of the substrate W rises, the centrifugal force applied to the liquid on the substrate W increases and the flow speed of the liquid at the substrate W rises. Furthermore, when the rotation speed of the substrate W is kept constant, an almost stable liquid flow is formed on the substrate W, whereas when the rotation speed of the substrate W is changed, a liquid flow on the substrate W changes. Thus, it is possible to drive the removal of the bubbles from the recess portion 83 by accelerating and decelerating in the rotation direction instead of continuing rotating the substrate W at high speed.

Meanwhile, when the flow rate of the liquid discharged toward the front surface of the substrate W increases, the flow speed of the liquid at the substrate W rises. Furthermore, when the discharge flow rate of the liquid is kept constant, an almost stable liquid flow is formed on the substrate W, whereas when the discharge flow rate of the liquid is changed, a liquid flow on the substrate W changes. Thus, it is possible to drive the removal of the bubbles from the recess portion 83 by changing the diluted ammonia water instead of continuing discharging the diluted ammonia water at a high flow rate.

The substrate processing apparatus 1 is not restricted to an apparatus that processes a disc-shaped substrate W and may be an apparatus that processes a polygonal substrate W.

Two or more arrangements among all the arrangements described above may be combined. Two or more steps among all the steps described above may be combined.

The spin chuck 8 is an example of a substrate holding unit. The spin motor 12 is an example of a substrate rotating unit. The first chemical liquid nozzle 31 is an example of a natural oxidation film removing unit. The second chemical liquid nozzle 41 is an example of an ammonia water supplying unit. The central nozzle 61 is an example of an IPA supplying unit.

The present application corresponds to Japanese Patent Application No. 2017-180697 filed in the Japan Patent Office on Sep. 20, 2017, and the entire disclosure of this application is incorporated herein by reference.

The embodiments of the present invention are described in detail above, however, these are just detailed examples used for clarifying the technical contents of the present invention, and the present invention should not be limitedly interpreted to these detailed examples, and the spirit and scope of the present invention should be limited only by the claims appended hereto.

REFERENCE SIGNS LIST

1: substrate processing apparatus
3: controller
8: spin chuck (substrate holding unit)
12: spin motor (substrate rotating unit)
13: shielding member
13s: lower surface of shielding member (facing surface)
21: processing cup
23: guard
23a: upper end of guard
26: cup
31: first chemical liquid nozzle (natural oxidation film removing unit)
41: second chemical liquid nozzle (ammonia water supplying unit)
49: second flow rate control valve (flow rate control valve)
61: central nozzle (IPA supplying unit)
61A: first tube
61B: second tube
65: solvent piping
66: solvent valve
67: solvent heater
81: base material
82: thin film
83: recess portion
83i: entrance
83b: bottom surface
83s: side surface
83o: opposing portion
84: thin film of polysilicon
84s: tip end surface
A1: rotation axis
Dt: thickness direction
Ds: surface direction
D1: depth of recess portion
L1: length of thin film of polysilicon
Th1: thickness of whole of thin films
W1: width of recess portion
Vhf: first high rotation speed
Vh2: second high rotation speed (second rotation speed)
VL1: low rotation speed (first rotation speed)
W: substrate

What is claimed is:

1. A substrate processing method comprising:
    a natural oxidation film removing step of removing a natural oxidation film of a group 14 element exposed at a side surface of a recess portion provided in a substrate and exposing a film of the group 14 element at the side surface of the recess portion;
    an IPA supplying step of bringing liquid IPA into contact with the film of the group 14 element after the natural oxidation film of the group 14 element is removed; and
    an ammonia water supplying step of supplying ammonia water to the substrate and etching the film of the group 14 element after the IPA comes into contact with the film of the group 14 element.

2. The substrate processing method according to claim 1, wherein
    the IPA supplying step includes a liquid film holding step of holding a liquid film of the IPA at an entire front surface of the substrate while rotating the substrate around a rotation axis perpendicular to a central portion of the substrate at a first rotation speed lower than a second rotation speed, and
    the ammonia water supplying step includes an ammonia water discharge starting step of starting discharging the ammonia water to be supplied to the substrate while increasing rotation speed of the substrate from the first rotation speed to the second rotation speed, and an ammonia water discharge continuing step of continuing discharging the ammonia water while keeping the rotation speed of the substrate at the second rotation speed after the ammonia water discharge starting step.

3. The substrate processing method according to claim 1, wherein a cycle including the IPA supplying step and the ammonia water supplying step is performed a plurality of times.

4. The substrate processing method according to claim 1, wherein the ammonia water supplying step includes at least one of an accelerating step of raising rotation speed of the substrate in a state where an entire front surface of the substrate is covered with a liquid film of the ammonia water and a flow rate increasing step of increasing a flow rate of the ammonia water discharged toward the front surface of the substrate in a state where the entire front surface of the substrate is covered with the liquid film of the ammonia water.

5. The substrate processing method according to claim 1, wherein the ammonia water supplying step includes a routine performing step of performing one or more times a routine including a first accelerating step of raising rotation speed of the substrate in a state where a liquid film of the ammonia water exists on a front surface of the substrate, a first decelerating step of lowering, after the first accelerating step, the rotation speed of the substrate in a state where the liquid film of the ammonia water exists on the front surface of the substrate, and a second accelerating step of raising, after the first decelerating step, the rotation speed of the substrate in a state where the liquid film of the ammonia water exists on the front surface of the substrate.

6. The substrate processing method according to claim 1, wherein the ammonia water supplying step includes a routine performing step of performing one or more times a routine including a first flow rate increasing step of increasing a flow rate of the ammonia water discharged toward a front surface of the substrate in a state where a liquid film of the ammonia water exists on the front surface of the substrate, a first flow rate decreasing step of decreasing, after the first flow rate increasing step, the flow rate of the ammonia water discharged toward the front surface of the substrate in a state where the liquid film of the ammonia water exists on the front surface of the substrate, and a second flow rate increasing step of increasing, after the first decelerating step, the flow rate of the ammonia water discharged toward the front surface of the substrate in a state where the liquid film of the ammonia water exists on the front surface of the substrate.

7. The substrate processing method according to claim 1, further comprising a closing step of causing a facing surface having an outer diameter equal to or larger than a diameter of the substrate to face a front surface of the substrate and causing an upper end of a tubular guard surrounding the substrate to be located at a height equal to the facing surface or at a height higher than the facing surface while horizontally holding the substrate with the front surface of the substrate directed upward when at least one of the IPA supplying step and the ammonia water supplying step is being performed.

8. The substrate processing method according to claim 1, wherein the film of the group 14 element extends from an entrance of the recess portion toward a bottom of the recess portion.

9. The substrate processing method according to claim 1, wherein
- the side surface of the recess portion includes a pair of opposing portions that face each other in a width direction perpendicular to a depth direction of the recess portion, and
- a length of the film of the group 14 element in the depth direction of the recess portion is longer than a gap between the pair of opposing portions in the width direction of the recess portion.

* * * * *